(12) United States Patent
Korenaga

(10) Patent No.: US 6,917,046 B2
(45) Date of Patent: Jul. 12, 2005

(54) POSITIONING APPARATUS, CHARGED-PARTICLE-BEAM EXPOSURE APPARATUS, AND DEVICE MANUFACTURING METHOD

(75) Inventor: Nobushige Korenaga, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/638,437

(22) Filed: Aug. 12, 2003

(65) Prior Publication Data

US 2004/0041103 A1 Mar. 4, 2004

(30) Foreign Application Priority Data

Aug. 30, 2002 (JP) ........................................ 2002-254988

(51) Int. Cl.⁷ .............................. G21K 5/10; G21G 5/00
(52) U.S. Cl. ................................. 250/492.2; 250/442.11
(58) Field of Search ............................ 250/492.2, 442.1, 250/442.11

(56) References Cited

U.S. PATENT DOCUMENTS

| | | | |
|---|---|---|---|
| 5,467,720 A | 11/1995 | Korenaga et al. | 108/20 |
| 5,518,550 A | 5/1996 | Korenaga et al. | 118/729 |
| 5,684,856 A | 11/1997 | Itoh et al. | 378/34 |
| 5,834,783 A * | 11/1998 | Muraki et al. | 250/398 |
| 5,841,250 A | 11/1998 | Korenage et al. | 318/135 |
| 6,002,465 A | 12/1999 | Korenaga | 355/53 |
| 6,037,680 A | 3/2000 | Korenaga et al. | 310/12 |
| 6,107,703 A | 8/2000 | Korenaga | 310/12 |
| 6,128,069 A | 10/2000 | Korenaga | 355/53 |
| 6,134,981 A * | 10/2000 | Novak et al. | 74/490.09 |
| 6,138,058 A * | 10/2000 | Van Antwerp et al. | 700/225 |
| 6,157,159 A | 12/2000 | Korenaga et al. | 318/649 |
| 6,172,738 B1 | 1/2001 | Korenaga et al. | 355/53 |
| 6,177,978 B1 | 1/2001 | Korenaga | 355/53 |
| 6,265,793 B1 | 7/2001 | Korenaga | 310/12 |
| 6,320,645 B1 | 11/2001 | Innoue et al. | 355/53 |
| 6,359,677 B2 | 3/2002 | Itoh et al. | 355/53 |
| 6,414,742 B1 | 7/2002 | Korenaga et al. | 355/53 |
| 6,479,991 B1 | 11/2002 | Korenaga | 324/226 |
| 6,493,065 B2 * | 12/2002 | Ina et al. | 355/53 |
| 6,566,664 B2 * | 5/2003 | Muraki | 250/492.2 |
| 6,570,645 B2 | 5/2003 | Korenaga et al. | 355/75 |
| 6,724,000 B2 * | 4/2004 | Hazelton | 250/442.11 |
| 2001/0031191 A1 | 10/2001 | Korenaga | 414/200 |
| 2003/0007140 A1 | 1/2003 | Korenaga | 355/72 |
| 2003/0102723 A1 | 6/2003 | Korenaga | 310/12 |

* cited by examiner

*Primary Examiner*—John P. Lee
*Assistant Examiner*—Kalimah Fernandez
(74) *Attorney, Agent, or Firm*—Fitzpatrick, Cella, Harper & Scinto

(57) ABSTRACT

A positioning apparatus includes a first stage, capable of moving in a first direction and a second direction which is orthogonal to the first direction, a second stage, arranged on the first stage and moved with the first stage, and capable of moving in the first direction and the second direction and capable of mounting an object to be adjusted in a position and a rotation, and a driving mechanism, arranged on the first stage, and for moving the second stage relative to the first stage. The driving mechanism includes a first electromagnet which generates first suction power, a second electromagnet, provided opposite to and away from the first electromagnet, which generates second suction power, and a core member, which is held movable between the first and second electromagnets, and moves by being pulled in accordance with the first and/or second suction power.

13 Claims, 20 Drawing Sheets

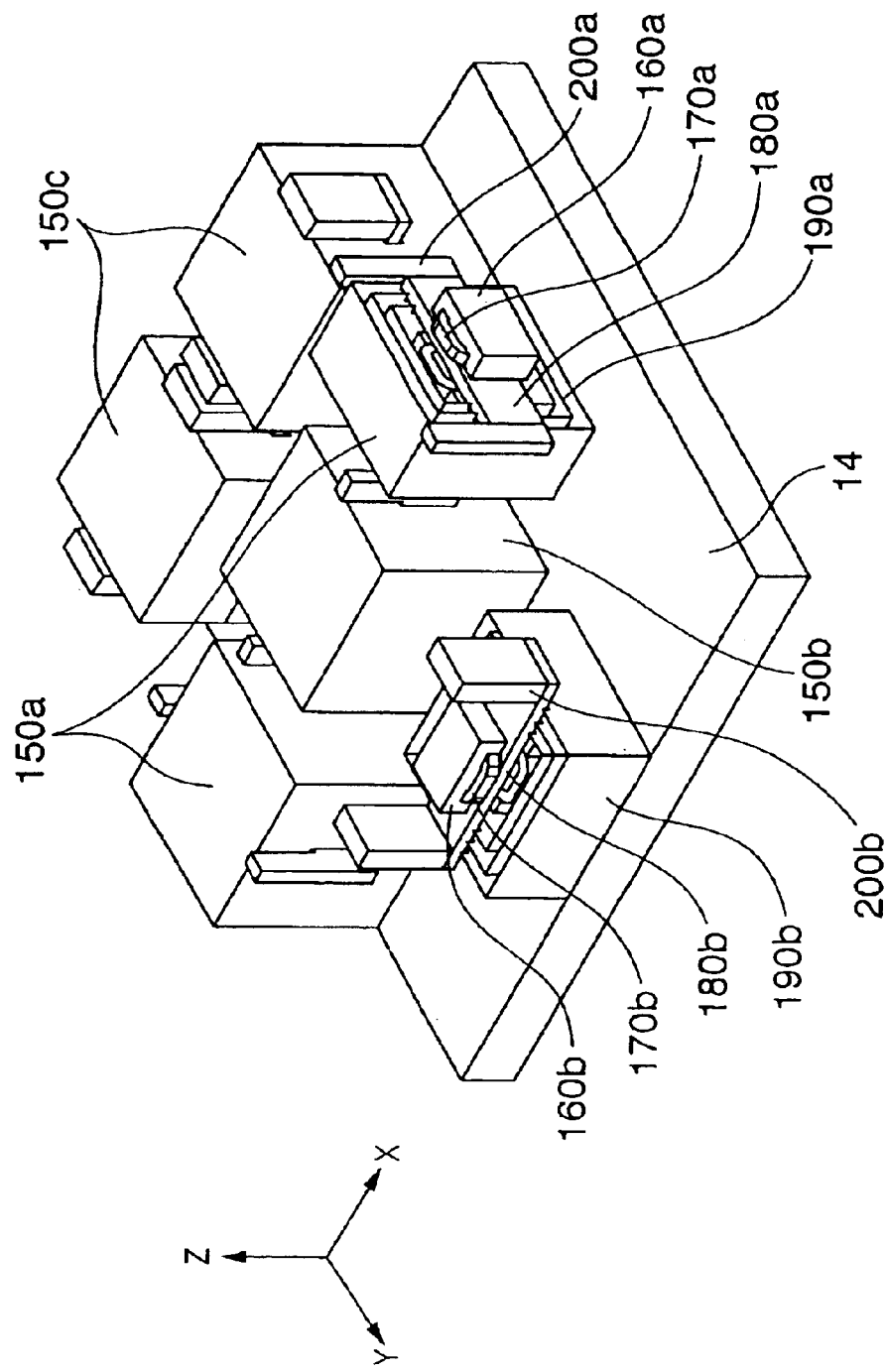

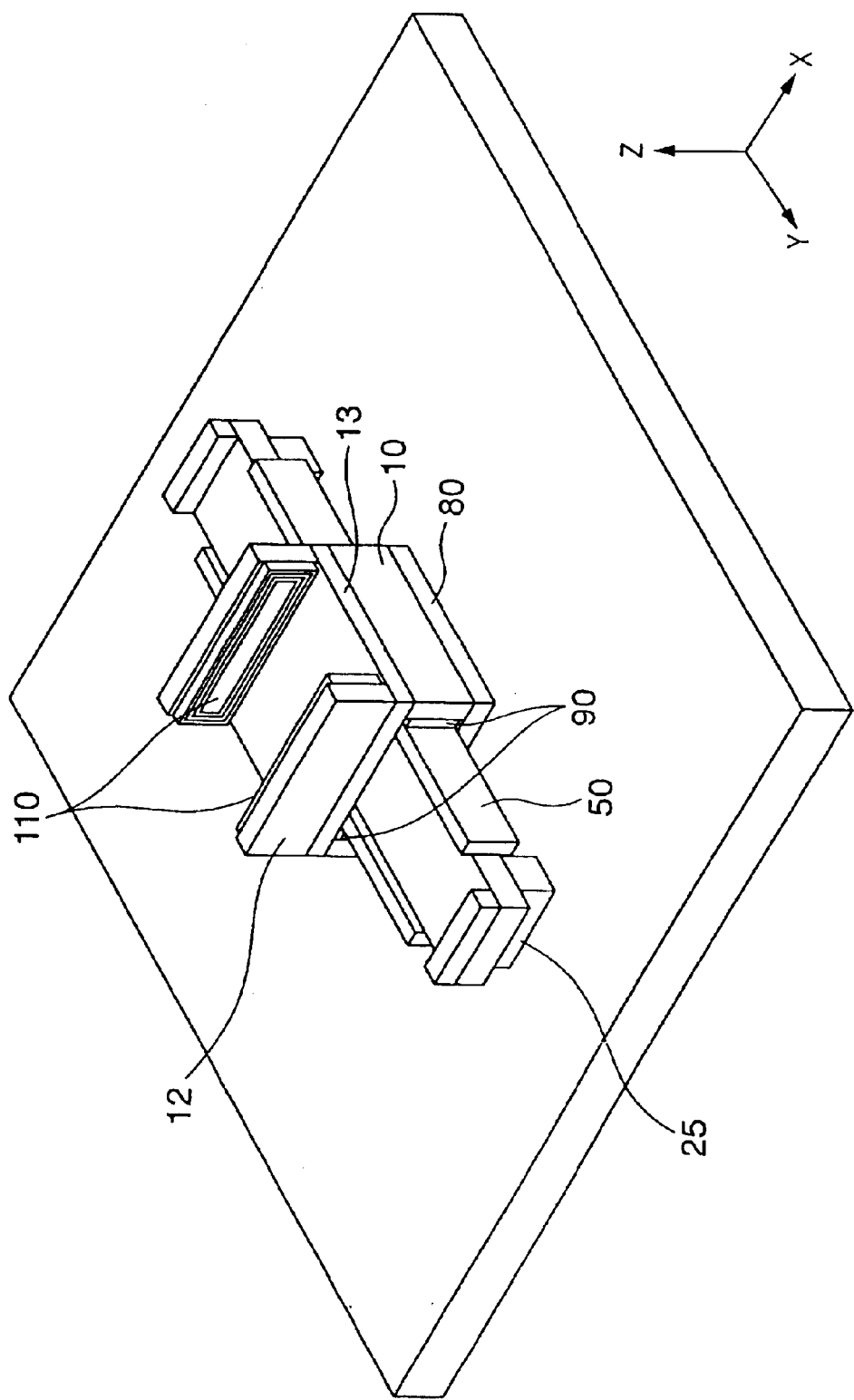

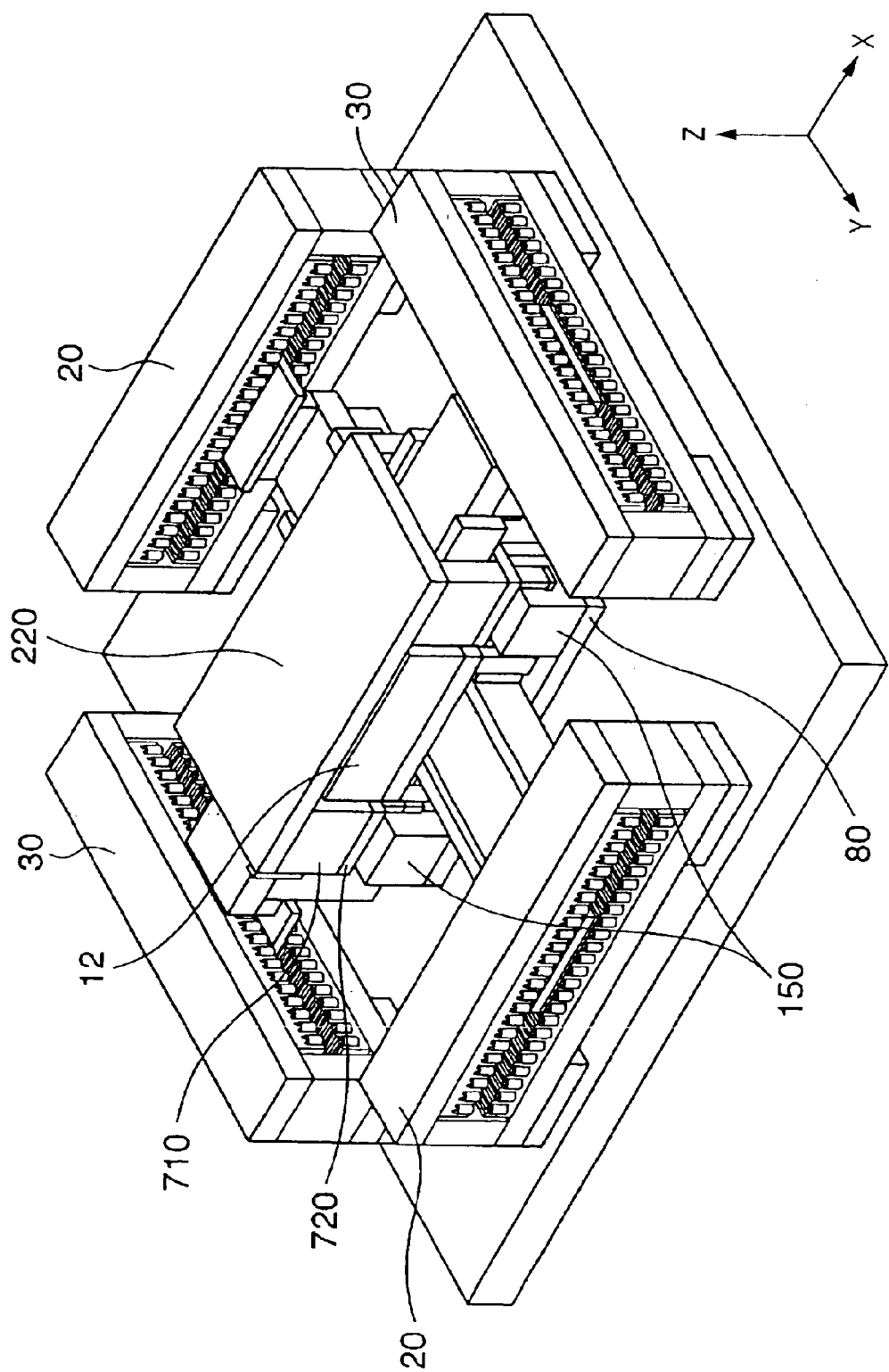

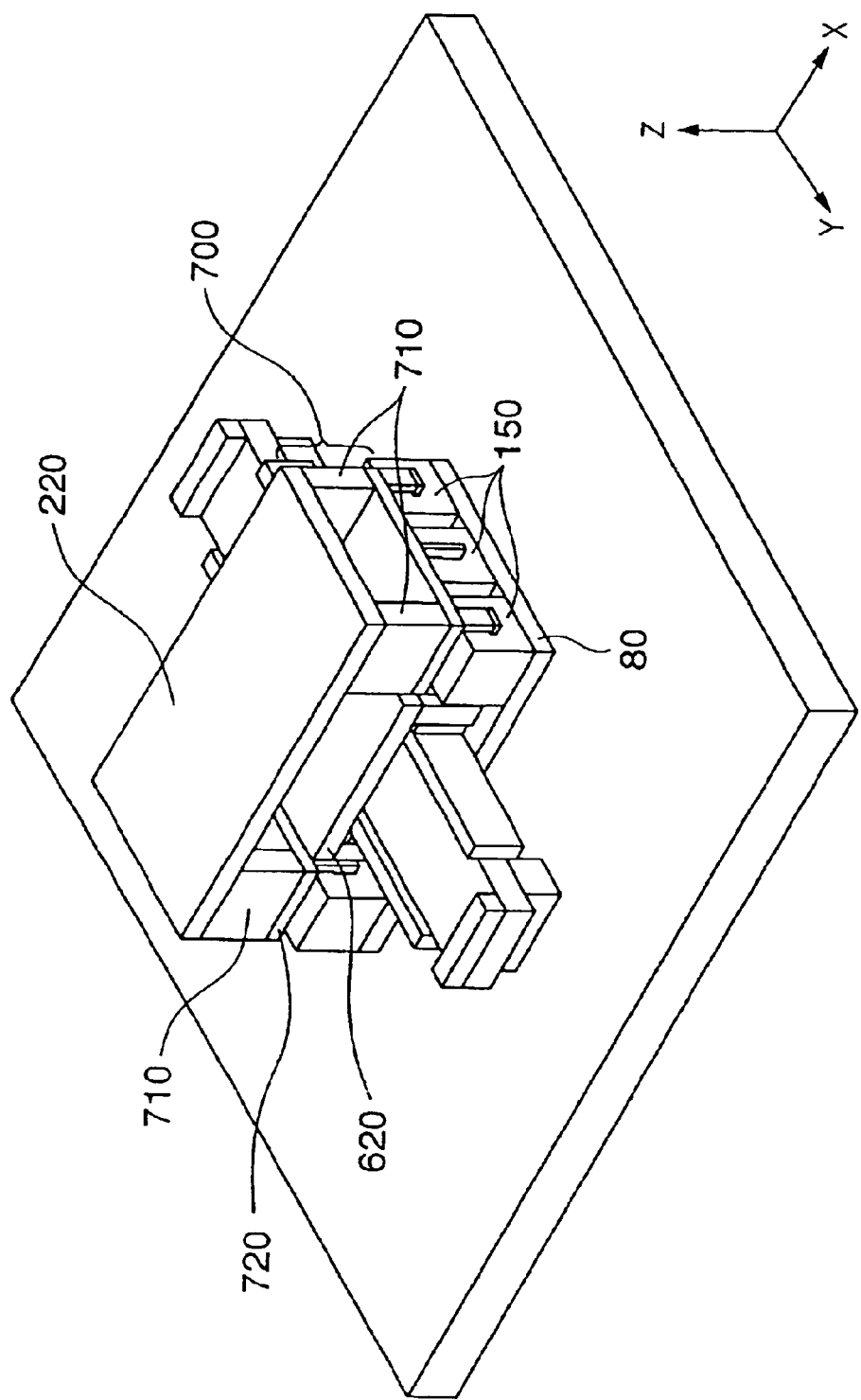

FIG. 2D
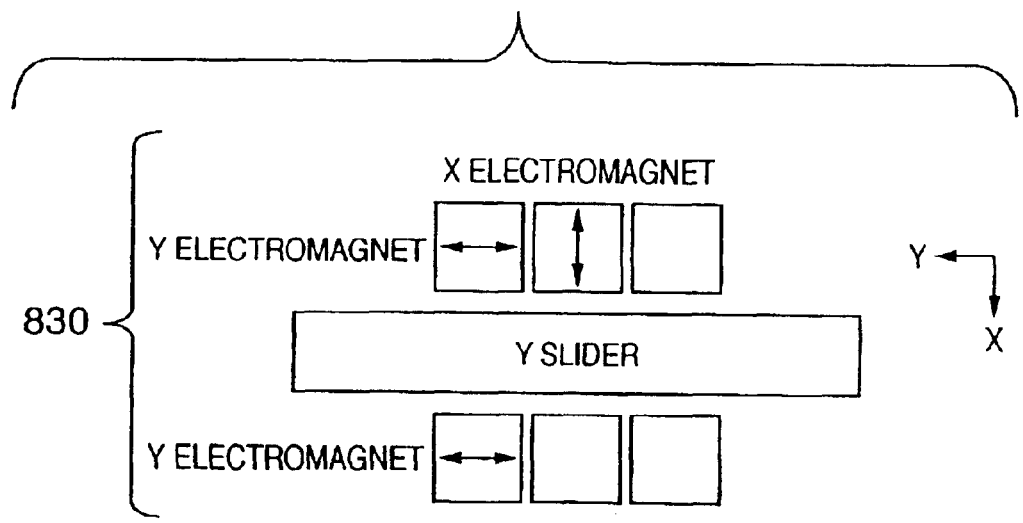
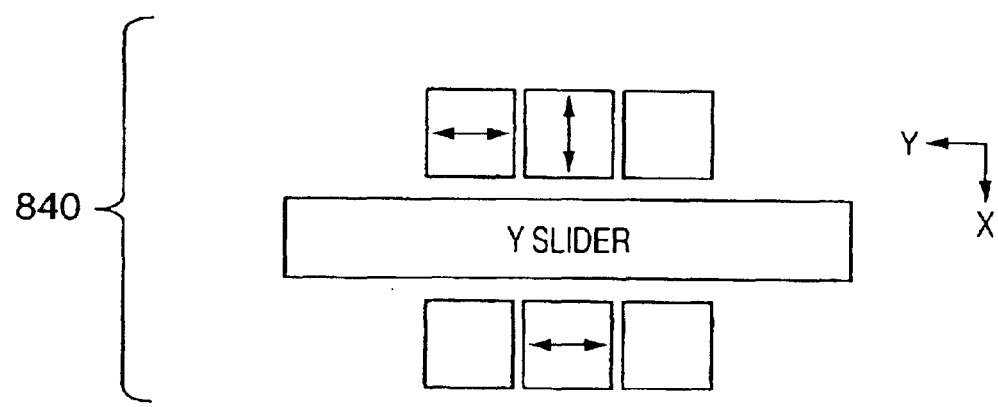
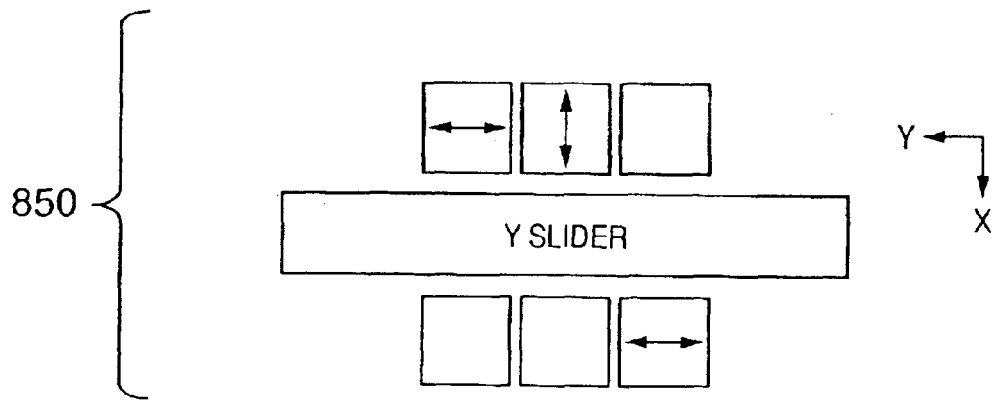

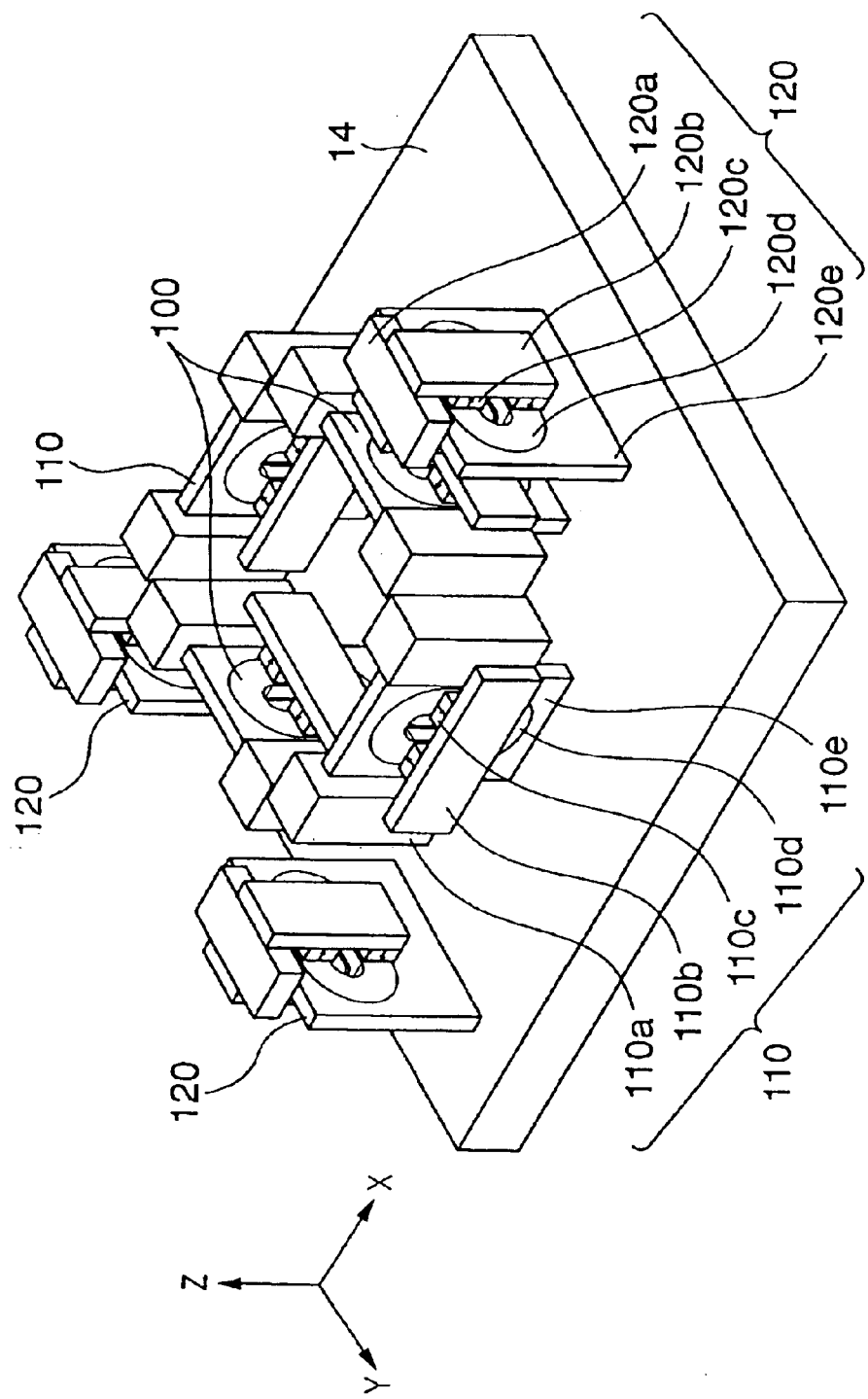

FIG. 9

```
URL  http://www.maintain.co.jp/db/input.html

TROUBLE DB INPUT SCREEN

DATE          2000/3/15    ~404
MODEL         * * * * * * * * *   ~401
TITLE         OPERATION ERROR (STARTUP ERROR)   ~403
MACHINE S/N   465NS4580001   ~402
URGENCY LEVEL  D   ~405
SYMPTOM       LED KEEPS BLINKING AFTER POWER
              IS TURNED ON                      ~406

TROUBLESHOOTING  TURN ON POWER AGAIN
METHOD           (PRESS RED BUTTON WHEN
                 STARTING UP THE MACHINE)       ~407

FOLLOW-UP     PROBLEM PROVISIONALLY SOLVED      ~408

[SEND] [RESET]        410              411                412
LINK TO DATABASE OF RESULT LIST   SOFTWARE LIBRARY   OPERATION GUIDE
```

SEMICONDUCTOR DEVICE MANUFACTURING FLOW

POSITIONING APPARATUS, CHARGED-PARTICLE-BEAM EXPOSURE APPARATUS, AND DEVICE MANUFACTURING METHOD

FIELD OF THE INVENTION

The present invention relates to a positioning apparatus applicable to a charged-particle-beam exposure apparatus, a charged-particle-beam exposure apparatus employing the positioning apparatus, and a semiconductor device manufacturing method using the charged-particle-beam exposure apparatus.

BACKGROUND OF THE INVENTION

Along with a heightened degree of exposure precision in exposure apparatuses, a stage used for an exposure apparatus has been proposed as a positioning apparatus for positioning an exposure target at a predetermined position with high precision in a short time. The stage (FIG. 4A) comprises: an XY stage for positioning the exposure target on the XY plane by moving the stage at high speed, and a six-axis precision stage provided on top of the XY stage for adjusting a position and a rotation angle of the target on the plane.

The XY stage 6 on the exposure apparatus stage includes an X linear motor 2 for driving the stage in the X-axis direction on the stage table 1, and a Y linear motor 3 for driving the stage in the Y-axis direction. Each of these linear motors serves as a driving source in the X and Y direction. The XY stage 6 is supported by a Y slider 5 and an X slider 4. On the XY stage 6, which comes into contact with slider guides (15, 16), air pads (9, 11) are provided. From the air pads, compressed air is issued to the guide members, thereby forming an air layer between the guide members and the sliders. Accordingly, friction in the sliding portions of the X and Y sliders (4, 5) is reduced, enabling the respective sliders (4, 5) to slide.

The XY stage 6 is driven at high speed and positioned at a target position with coarse precision. Further, in order to adjust the position and rotation angle of the exposure target with high precision, a precision stage 7 is arranged on top of the XY stage 6. By driving the precision stage 7, the exposure target is positioned at a predetermined exposure position (target position) with high precision.

The precision motion mechanism of the precision stage employs precision linear motors for six axes (three axes in the translational directions and three axes in the rotational directions). By driving the linear motors, the position of the precision stage with respect to the translational directions and the rotational posture of the precision stage with respect to each axis are adjusted.

FIG. 4B shows in detail an arrangement of the six-axis precision linear motors provided for driving the precision stage 7. As shown in FIG. 4B, the precision linear motors consist of: two X precision linear motors 100, two Y precision linear motors 110, and three Z precision linear motors 120. In order to realize motion in the directions of six axes, seven linear motors are arranged.

Each precision linear motor comprises: an oval flat coil (110d, 120d, and so on) having a hollow core, magnets (110c, 120c, and so on) provided in a way to sandwich the flat coils from both sides, and yokes (110b, 120b, and so on). The precision linear motors employ the so-called Lorentz force. Each linear motor generates thrust in a direction (direction of the arrows in FIG. 4B), which is orthogonal to the straight line portion of each oval coil, on the plane parallel to the flat surface of each oval flat coil.

With regard to the X precision linear motor 100, the flat surface of the oval coil is parallel to the XZ plane and the straight line portion of the oval coil is parallel to the Z axis. With regard to the Y precision linear motor 110, the flat surface of the oval coil is substantially parallel to the YZ plane and the straight line portion of the oval coil is parallel to the Z axis. With regard to the Z precision linear motor 120, the flat surface of the oval coil is substantially parallel to the YZ plane and the straight line portion of the oval coil is parallel to the Y axis. By virtue of this configuration, thrust is generated in the X, Y, and Z directions. The yokes are moved based on the thrust, thereby adjusting the position and rotation angle with respect to the direction of each plane (XY plane, YZ plane, ZX plane) and the rotational directions (rotation about the X axis, Y axis, Z axis).

Each coil of the respective linear motors is fixed to a top plate 14 of the XY stage 6 through a coil frame (e.g., 110e of the Y precision linear motor 110). Each magnet (e.g., 110c of the Y precision linear motor) and yoke (e.g., 110b of the Y precision linear motor) are fixed to a precision-motion top plate 21 through a yoke fixing member (110a of the Y precision linear motor).

The stage mechanism shown in FIG. 4A having the above-described configuration has the following advantages. The stage mechanism has a lighter transfer mass of the driving axis, compared to a stage mechanism having one stage moving in one axis direction and having another stage thereupon moving in another axis direction (e.g., X stage driving in X direction arranged on top of Y stage driving in Y direction). Another advantage is in that the linear motors, which become the source of heat, can be arranged far from a wafer.

The exposure apparatus stage, incorporating the six-axis precision stage employing the Lorentz force on top of the XY stage, is advantageous because highly precise position and rotation angle control can be achieved during a long stroke of the stage.

Meanwhile, along with the downsizing of patterns exposed by exposure apparatuses, attention is given to a charged-particle-beam exposure apparatus, e.g., an electron beam (EB) exposure apparatus, an ion beam exposure apparatus or the like. If the configuration of the conventional six-axis precision motion mechanism is to be employed in the charged-particle-beam exposure apparatus, it causes two problems: (a) it is prone to leak magnetic flux; and (b) the size of the precision linear motor becomes large.

Although the stationary members of the precision linear motors (100, 110, 120 in FIG. 4B) have a closed magnetic circuit, magnetic flux easily leaks from both sides of the magnets. Also, the magnetic field generated by the coils tends to leak outside. In other words, since permanent magnets are used, magnetic flux is always generated even at the time of not generating a driving force for precision motion, and causes an external leakage. Such magnetic flux leakage disturbs the electron-optical system of the EB exposure apparatus, causing deterioration in the precision of electron beam rendering.

Furthermore, the typical size of the precision linear motor is about 100 mm (length)×40 mm (width), and 50 mm (depth). In a case where a magnetic shield is provided in order to seal the aforementioned magnetic flux leakage, the size of the precision linear motor including the magnetic shield becomes larger than the typical size, and the occupying area of the linear motors is enlarged.

Furthermore, since it is extremely difficult to provide a threefold or fourfold shield in the linear motor of the aforementioned size, it is substantially impossible to employ the conventional six-axis precision stage in the charged-particle-beam exposure apparatus.

SUMMARY OF THE INVENTION

In order to solve the above-described problems, the present invention has an object to provide a positioning apparatus, which eliminates the influence of a magnetic flux leakage and is applicable to a charged-particle-beam exposure apparatus, a charged-particle-beam exposure apparatus employing the positioning apparatus, and a semiconductor device manufacturing method using the charged-particle-beam exposure apparatus.

In order to attain the above object, the positioning apparatus and charged-particle-beam exposure apparatus employing the positioning apparatus according to the present invention have the following configurations.

The above-described object of the present invention is achieved by a positioning apparatus comprising:

a first stage, capable of moving in a first direction and a second direction which is orthogonal to the first direction;

a second stage, arranged on the first stage, and capable of adjusting a position and a rotation on the first stage; and a driving mechanism for positioning the second stage, wherein the driving mechanism includes:

a first electromagnet which generates first suction power;

a second electromagnet, provided opposite to and away from the first electromagnet, which generates second suction power; and a core member, which is held movable between the first and second electromagnets, and moves by being pulled in accordance with the first and/or second suction power.

Furthermore, the above-described object of the present invention is also achieved by a charged-particle-beam exposure apparatus, comprising:

a charged-particle source for irradiating a charged-particle beam;

a first electron optical system, having a plurality of electron lenses, for forming a plurality of intermediate images of the charged-particle source by the plurality of electron lenses;

a second electron optical system for projecting the plurality of intermediate images, formed by the first electron optical system, on a substrate; and a positioning apparatus, holding the substrate, for driving to a predetermined position to perform positioning, wherein the positioning apparatus comprises:

a first stage, capable of moving in a first direction and a second direction which is orthogonal to the first direction;

a second stage, arranged on the first stage, and capable of adjusting a position and a rotation on the first stage; and a driving mechanism for positioning the second stage, wherein the driving mechanism includes:

a first electromagnet which generates first suction power;

a second electromagnet, provided opposite to and away from the first electromagnet, which generates second suction power; and a core member, which is held movable between the first and second electromagnets, and moves by being pulled in accordance with the first and/or second suction power.

Other features and advantages of the present invention will be apparent from the following descriptions taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1C is an enlarged view showing a configuration of the electromagnet unit 150;

FIG. 1E is a perspective view of a vacuum pad 110 arranged on an XY slider Y side plate 12;

FIG. 2A is a view showing a configuration of a positioning apparatus according to the second embodiment;

FIG. 2B is a view showing a state in which the electromagnet unit 150 is fixed to an XY slider bottom plate 80 in the configuration of the positioning apparatus shown in FIG. 2A;

FIG. 2D is a view showing arrangement patterns of the fixed electromagnet units;

FIG. 4B is a view showing in detail an arrangement of a six-axis precision linear motor according to the conventional example;

FIG. 9 shows an example of a user interface;

DETAILED DESCRIPTION OF THE PREFERRED EMBODIMENTS

Preferred embodiments of the present invention will now be described in detail in accordance with the accompanying drawings.

<First Embodiment>
<Overall Configuration of Stage>

Figure 1A:
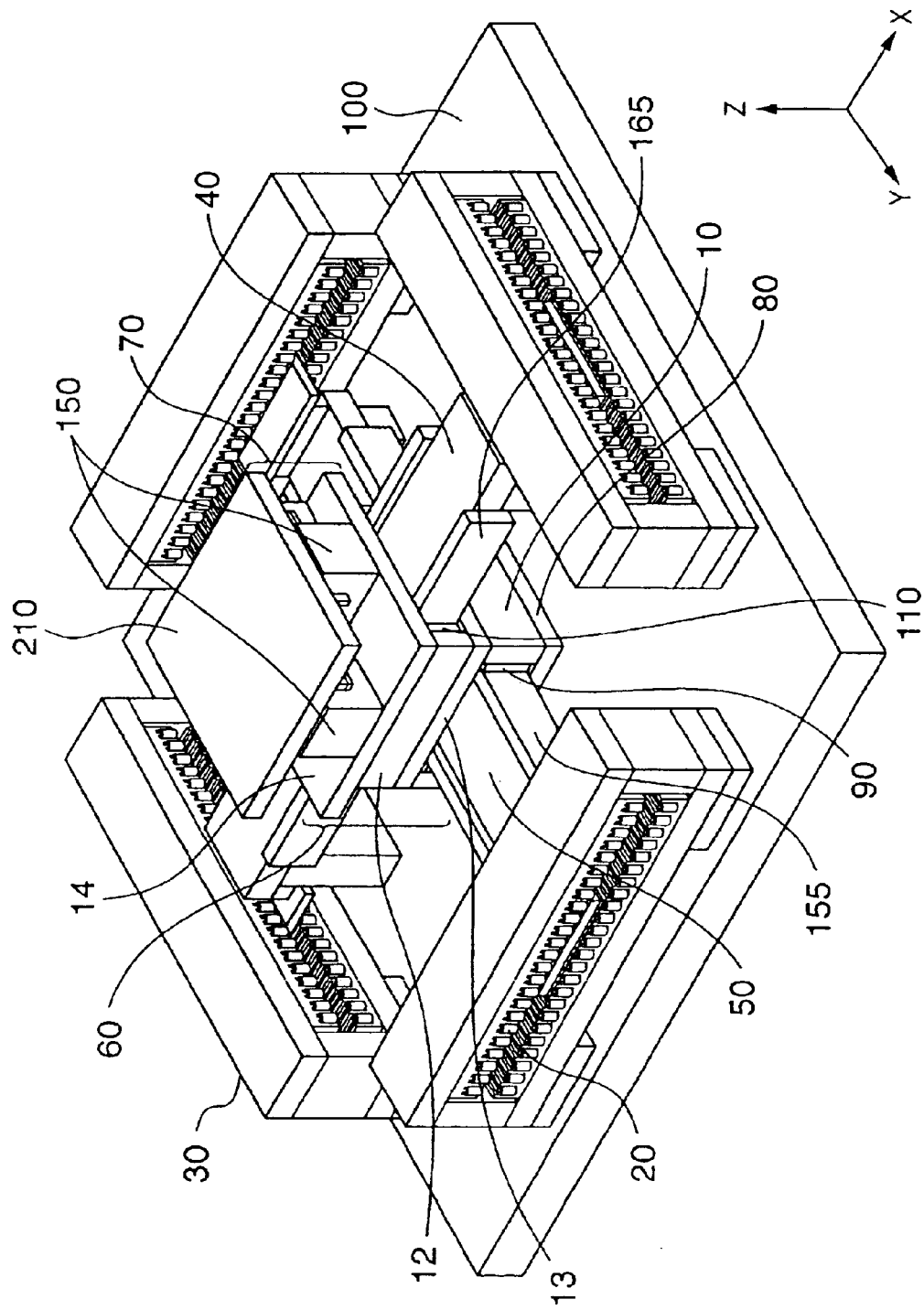
FIG. 1A is a view showing a configuration of a positioning apparatus according to the first embodiment.

A configuration of the positioning apparatus according to the first embodiment is shown in FIG. 1A. The stage is basically constructed with a stage table 100, a Y slider 50, an X slider 40, an XY slider 60, a Y linear motor 30, an X linear motor 20, a six-axis precision stage 700, and a precision-motion top plate 210.

On the stage table 100, the X linear motor 20 is provided for driving the XY slider 60 in the X-axis direction, and the Y linear motor 30 is provided for driving the XY slider 60 in the Y-axis direction. Each of the linear motors serves as a driving source in the X and Y directions.

The XY slider 60 is supported by a Y slider 50 and an X slider 40. An air slide mechanism (not shown) is provided on the bottom surface of the Y slider 50 and X slider 40 to form an air layer on the sliding surface between guide members and the sliders, thereby reducing friction. Accordingly, respective sliders become slidable.

On the XY slider 60 which comes into contact with guide members (155, 165) of respective sliders, vacuum pads (90, 110) are provided. From the vacuum pads, compressed air is issued to the guide members, thereby forming an air layer between the guide members and the sliders. Accordingly, friction in the sliding portions of the X and Y sliders (50, 40) is reduced, enabling the respective sliders (50, 40) to slide. FIG. 1E shows a state in which the vacuum pads 110 are arranged. Since the charged-particle-beam exposure apparatus is used in a vacuum, the conventional air pads cannot be used. However, by employing vacuum pads which retrieve the issued air by suction, the similar effects can be achieved.

With respect to the relation between the Y slider 50 and X slider 40, the X slider 40 is placed above the Y slider 50 in the Z direction. The XY slider 60 is arranged at the center position of intersection between the Y slider 50 and the X slider 40.

The XY slider 60 comprises an XY slider bottom plate 80, which faces the stage table 100 through the air slide mechanism (not shown). On the XY slider bottom plate 80, two pieces of XY slider X side plates 10 are attached to support the vacuum pad 90 which guides sliding of the Y slider 50.

Similarly, the XY slider 60 comprises XY slider Y side plates 12 for supporting the vacuum pad 110 which guides sliding of the X slider 40. Between the Y side plates 12 and X side plates 10, an XY slider intermediate plate 13 is provided. On the top plate 14 of the XY slider 60, a precision stage 70 is arranged. The XY slider 60 holds the Y slider 50 and X slider 40 in the substantially orthogonal state, and slides along the Y guide 155 and X guide 165 on the stage table 100.

The X linear motor 20 and Y linear motor 30 are provided respectively on both sides of the Y slider 50 and X slider 40. Using the linear motors as a driving source, the XY slider moves a long distance at high speed, and performs positioning on the XY plane.

<Precision Motion Mechanism>

A precision stage driving mechanism for adjusting a position and a rotation angle of the precision stage 70 is arranged on the top plate 14 of the XY slider 60. The driving mechanism is configured with a shielded electromagnet unit 150 (hereinafter referred to as an electromagnet unit). On top of the electromagnet unit 150, the precision-motion top plate 210 is provided. A chuck mechanism (not shown), which holds a wafer subjected to exposure, is provided on the precision-motion top plate 21.

Figure 1B:
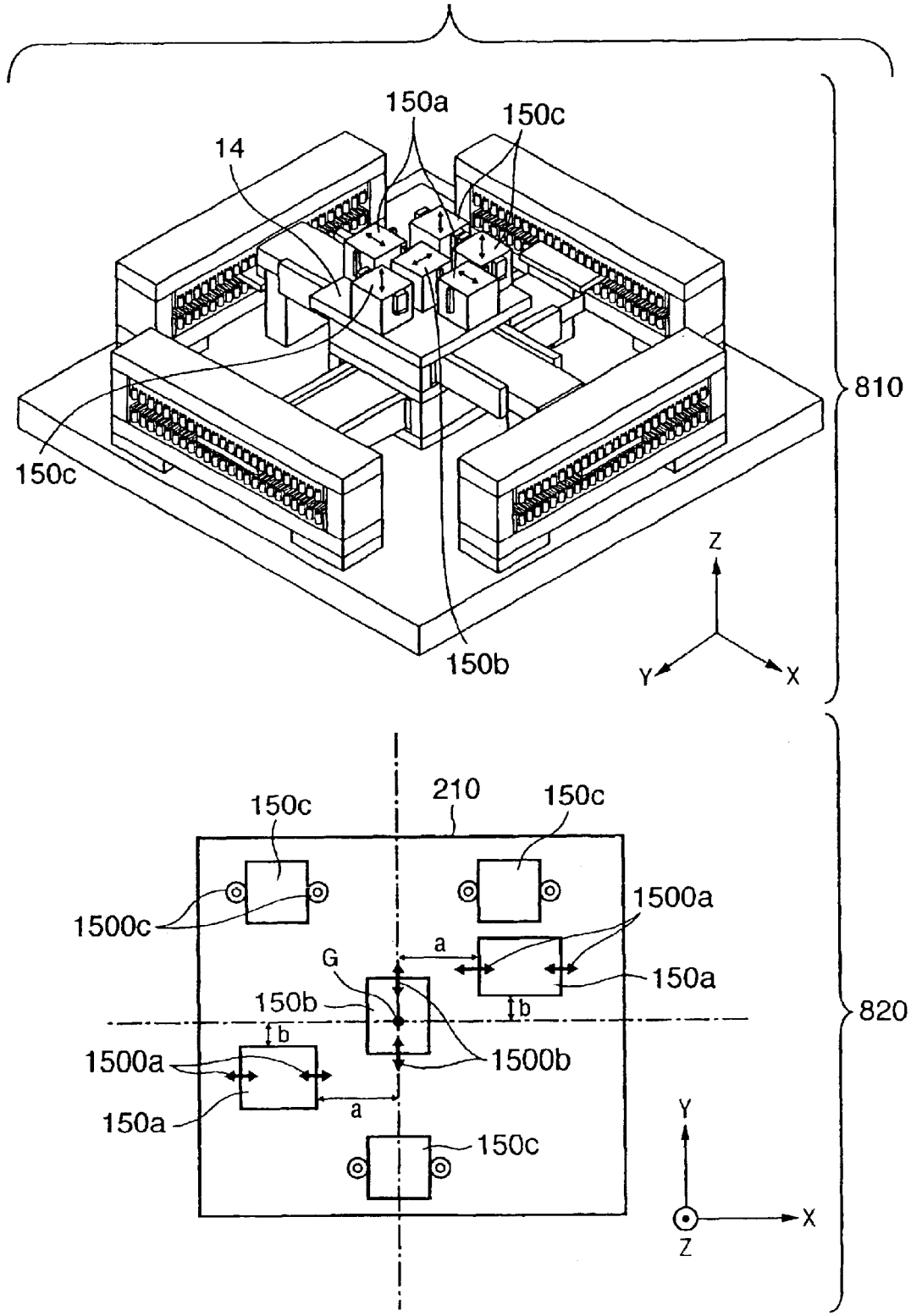
FIG. 1B is an explanatory view of the positioning apparatus shown in FIG. 1A, wherein 810 shows in detail an arrangement of an electromagnet unit 150 from which a precision-motion top plate 210 is removed, and 820 shows an arrangement of the electromagnet units.

Numeral 810 in FIG. 1B shows an arrangement of the electromagnet unit 150 in the positioning apparatus shown in FIG. 1A, from which the precision-motion top plate 210 is removed. FIG. 1C is an enlarged view of the construction of the electromagnet unit 150.

As shown by numeral 810 in FIG. 1B, six electromagnet units are arranged on the top plate 14 of the XY slider 60. Numeral 150*a* denotes an X electromagnet; 150*b*, a Y electromagnet; and 150*c*, a Z electromagnet. The arrow shown in each electromagnet unit schematically indicates the direction of displacement. Each electromagnet unit is constructed with a pair of E-cores (corresponds to 160*a* and 160*b* in FIG. 1D in a case of the X electromagnet 150*a* and Y electromagnet 150*b*) around which the coil (170*a*, 170*b*) is wound, an I-core (180*a*, 180*b*) sandwiched by the pair of E-cores, and a shield (190*a*, 190*b*) surrounding the cores. Although FIG. 1C shows an example of threefold shields (190*a*, 190*b*), the effect of the first embodiment is not limited to this number of shields.

Permalloy is often used as a material of the shield (190*a*, 190*b*), but the material is not limited to this. The E-core (160*a*, 160*b*) and I-core (180*a*, 180*b*) are generally formed with a multi-layer steel plate, e.g., a silicon steel plate.

When an electric current is applied to the coils (170*a*, 170*b*) wound around the E-cores (160*a*, 160*b*), the E-cores (160*a*, 160*b*) produce effects as electromagnets, generating suction power to pull the I-cores (180*a*, 180*b*). In accordance with the suction power, the I-cores (180*a*, 180*b*) can be pulled in the E-core direction and moved in a predetermined direction. Therefore, the electromagnet units are arranged in a way that a desired direction of force (direction to move the I-core) matches the direction of the normal of the I-core.

Figure 1D:
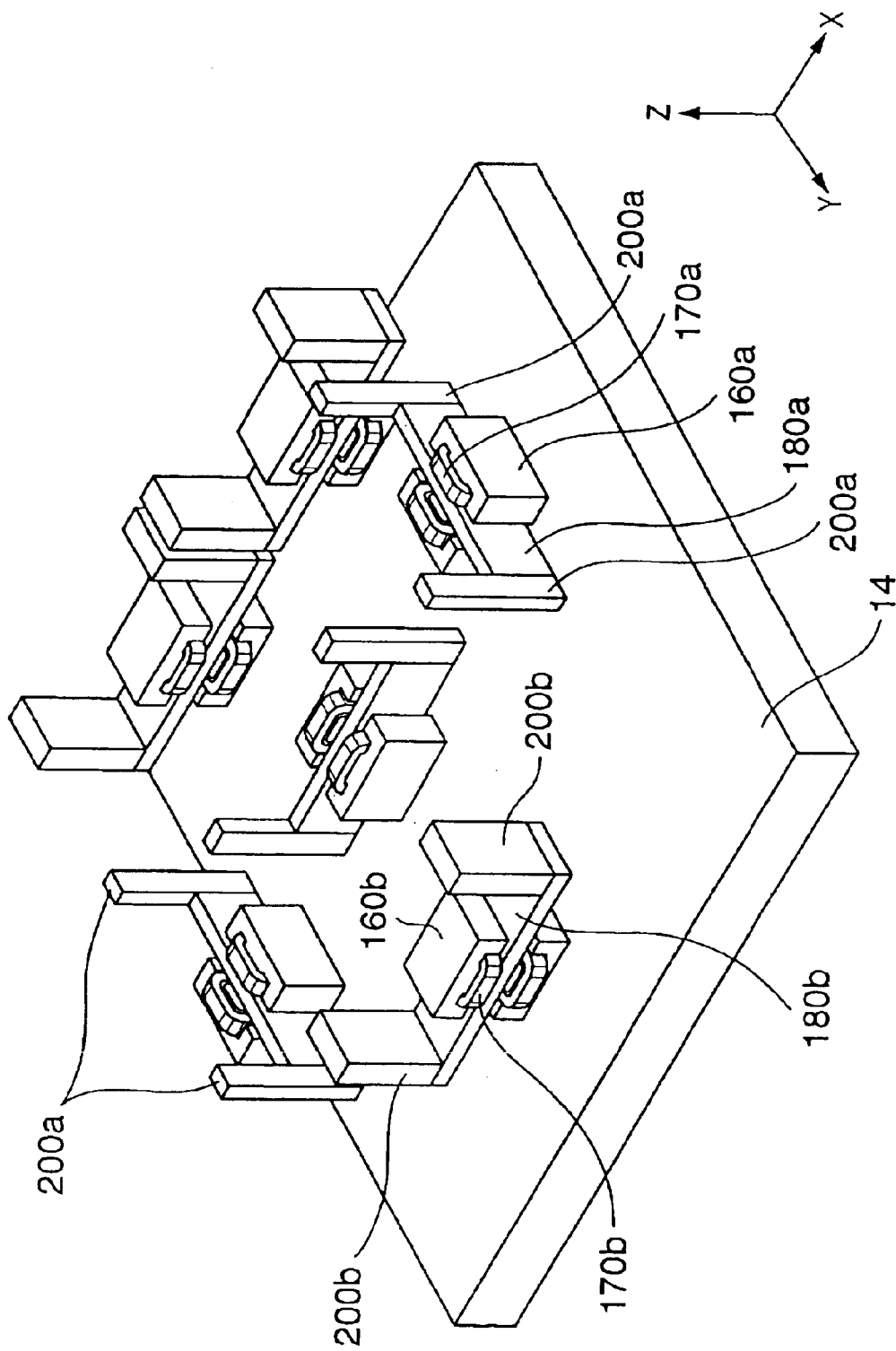
FIG. 1D is a view showing a configuration of the electromagnet unit 150 shown in FIG. 1C, from which shield members (190a, 190b) are removed, and in which a pair of electromagnet units is arranged in a way to sandwich an I-core (180a, 180b)

FIG. 1D shows a configuration of the electromagnet unit shown in FIG. 1C, from which the shield members (190*a*, 190*b*) are removed, and in which the pair of electromagnet units is arranged in a way to sandwich the I-core (180*a*, 180*b*). By controlling a current applied to each coil, suction power is generated to pull the I-core, and the motion of the I-core is used to adjust the position and rotation angle of the precision-motion top plate 210. To generate force (displacement) by the electromagnet unit 150, a current may be applied to one of the pair of E-cores, or a current may be applied to both of the E-cores to utilize the difference between suction power of the E-cores for generating the force (displacement to move the I-core) to pull the I-core.

Among the six electromagnet units in FIG. 1C, three units are used for the Z-direction driving mechanism (150*c*), two units are used for the X-direction driving mechanism (150*a*), and one unit is used for the Y-direction driving mechanism (150*b*). Each of the I-cores is arranged so that the normal direction thereof is directed to the thrust generating direction.

The three Z-direction electromagnet units (150*c*) perform position control regarding a position in the Z direction, and rotation control regarding a rotation angle $\omega x$ rotating about the X axis and a rotation angle $\omega y$ rotating about the Y axis. Similarly, the two X-direction electromagnet units (150*a*) perform position control regarding a position in the X direction, and rotation control regarding a rotation angle $\omega Z$ rotating about the Z axis. The Y-direction electromagnet unit (150*b*) performs position control regarding a position in the Y direction.

Numeral 820 in FIG. 1B shows an example of an arrangement of the electromagnet units on the precision-motion top plate 210. The three Z electromagnet units 150*c* are arranged so as to surround the center of gravity (G) of the top plate 210. The two X electromagnet units 150*a* are arranged so that two lines of action thereof are respectively away from the center of the gravity of the top plate 210 by a substantially equal distance (a in X direction, b in Y direction). The Y electromagnet unit 150b is arranged so that the line of action thereof substantially matches the center of gravity (G) of the top plate 210.

Referring to numeral 820 in FIG. 1B, the arrow 1500a schematically indicates the direction of displacement generated by the X electromagnet unit 150a. Similarly, the arrow 1500b indicates the direction of displacement generated by the Y electromagnet unit 150b. Furthermore, numeral 1500c (◎) schematically indicates a displacement in Z direction orthogonal to the plane, which is generated by the Z electromagnet unit 150c.

The E-cores and threefold shield are fixed to the top plate 14. The I-cores are fixed to the precision-motion top plate 210 through fixing members (200a, 200b).

<Controlling Precision Motion Mechanism>

In order to perform operation for controlling motion of the precision motion mechanism, it is necessary to take into consideration the fact that the electromagnet generates suction power that is proportional to the square of the current, and that the suction power is determined by a difference between suction power of the two electromagnets.

An electromagnet is superior to a linear motor because it produces a larger force when compared in the same volume, it generates a small amount of heat, and it does not produce magnetic flux in the absence of current application to magnetic circuits.

With respect to suction power, an electromagnet is compared with a linear motor. To produce a force of about 150N, the linear motor requires a typical size of about 100 (mm)×40 (mm)×50 (mm), whereas the electromagnet requires about 30 (mm)×30 (mm)×30 (mm). Therefore, an electromagnet requires a smaller occupying area compared to the case of utilizing a linear motor, thus allowing room for providing threefold shields as shown in FIG. 1C. By providing multiple shields, it is possible to eliminate the magnetic flux leakage.

An air gap in the magnetic circuit, configured with the E-cores and I-cores, can be reduced by single-digit to double-digit numbers, compared to a linear motor. Therefore, when a current is applied, there is less magnetic flux leakage than the case of using a linear motor. Furthermore, an electromagnet does not produce magnetic flux in the absence of current application. Therefore, combined with the aforementioned multiple shields and the reduced air gap in the magnetic circuit, the magnetic flux leakage can be made extremely small, compared to a linear motor. Since an influence of the magnetic flux leakage can be made extremely small as described above, electromagnets can be utilized in the driving mechanism of the charged-particle-beam exposure apparatus, which is easily damaged by magnetism.

In a case where an electromagnet is used as a driving source, since the amount of heat generated by the electromagnet is smaller than the case of using a linear motor, the driving source does not cause problems, e.g., deformation of an exposure target due to the influence of heat.

Figure 1F:
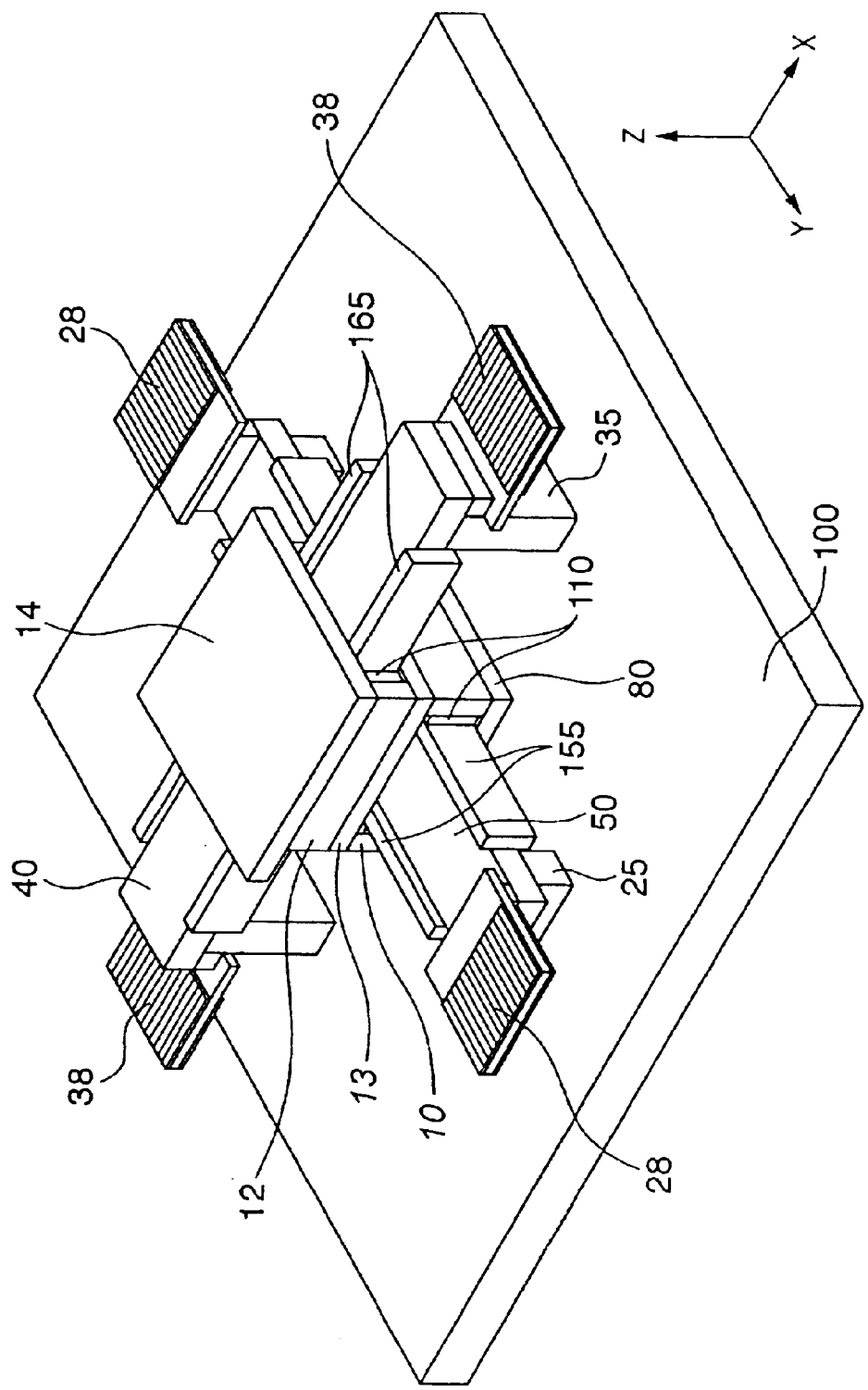
FIG. 1F is a view showing in detail a configuration of the movable member portion of the linear motor shown in FIG. 1A.

The aforementioned linear motors 20 and 30 for driving the Y slider 50 and X slider 40 are a coil-fixed magnet-movable type as shown in FIGS. 1A and 1F. The linear motors 20 and 30 are two-phase sinusoidal-wave driving type, which select two coils in accordance with the position of the magnet, and appropriately control the magnitude and direction of the current, thereby realizing a long-stroke driving of the sliders. The linear motor is constructed with a pair of quadrupole magnets provided in a way to sandwich movable magnetic coils from both sides, yokes provided on the back surfaces of the respective quadrupole magnets, and a movable member (28, 38) which connects the yokes.

The position of the X slider 40, the position of the Y slider 50, and the position and rotation angle of the precision-motion top plate 210 are measured by a sensor (not shown). It is preferable that the positions of the X slider 40 and Y slider 50 be measured by at least a one-axis laser interferometer, and the position and rotation angle of the top plate 210 be measured by at least a six-axis laser interferometer.

<Second Embodiment>

A configuration of the positioning apparatus according to the second embodiment is shown in FIGS. 2A to 2D. The precision motion driving mechanism of the second embodiment employs the same electromagnet unit 150 described in the first embodiment. However, the electromagnet unit 150 is not fixed to the top plate 14 of the XY slider 60 (see FIG. 1A), but is fixed to the XY slider bottom plate 80 (see FIG. 1A).

The second embodiment differs from the first embodiment in the configuration of the XY slider, the fixture position and arrangement of the electromagnet unit provided for precision motion driving, and the configuration of the top plate of the precision stage. These are described below in order.

First, the XY slider is described. The XY slider bottom plate 80 is larger and wider than that of the first embodiment. This is for placing six electromagnet units on the top surface of the bottom plate 80 for precision motion driving. Between the back surface of the XY slider bottom plate 80 and the XY stage table, an air slide system is structured using an air pad (not shown). The air pad (not shown) is a vacuum pad similar to that shown in FIG. 1E. On the top surface of the bottom plate 80, two XY slider X side plates uprise. On top of the two X side plates, an XY slider intermediate plate 620 (FIG. 2B) is placed. On top of the intermediate plate 620, two XY slider Y side plates are placed, as similar to the first embodiment.

The configuration and function of the periphery of the X side plates and Y side plates are the same as that of the first embodiment. However, since the precision motion driving system is placed on the bottom plate 80 (FIG. 2A), in other words, the top plate for placing the precision motion driving system becomes unnecessary, the XY slider top plate is omitted. This achieves a structural effect of a reduced height of the entire positioning apparatus.

Since the XY slider bottom plate 80 is large, as mentioned above, it can secure enough space for arranging the precision motion driving system on both sides of the two X side plates. However, since it is structurally impossible to place objects under the Y slider, the precision motion driving system can only be placed on both sides of the Y slider or the X side plates. This structural circumstance becomes a constraint to the arrangement of the precision motion driving system in the second embodiment.

Under the constraint of the space, the second embodiment is constructed such that the horizontal translational force can push the center of gravity of the precision motion structure in the X and Y directions. The same electromagnet units described in the first embodiment are used as a driving source. There are only three arrangements that achieve the driving of the driving system, which include: the arrangement shown in FIG. 2C (840 in FIG. 2D), and two other arrangements (830 and 850 in FIG. 2D) having an inferior response to the above-mentioned arrangement. A form of arrangement that is rotationally symmetrical to the aforementioned three arrangements is considered as the same arrangement.

With respect to a translational force in the Y direction, it is essential to arrange two Y electromagnet units. In order for one Y electromagnet unit to push the center of gravity of the precision motion structure, it is necessary for the electromagnet unit to be positioned near midway between the two X side plates. However, such an arrangement is structurally impossible because the Y slider is arranged here. Therefore, two Y electromagnet units are arranged on both sides of the Y slider in a way to sandwich the Y slider. As a result, the apparent line of action of the overall suction power of the two Y electromagnet units can match the center of gravity of hte precision motion structure.

Figure 2C:
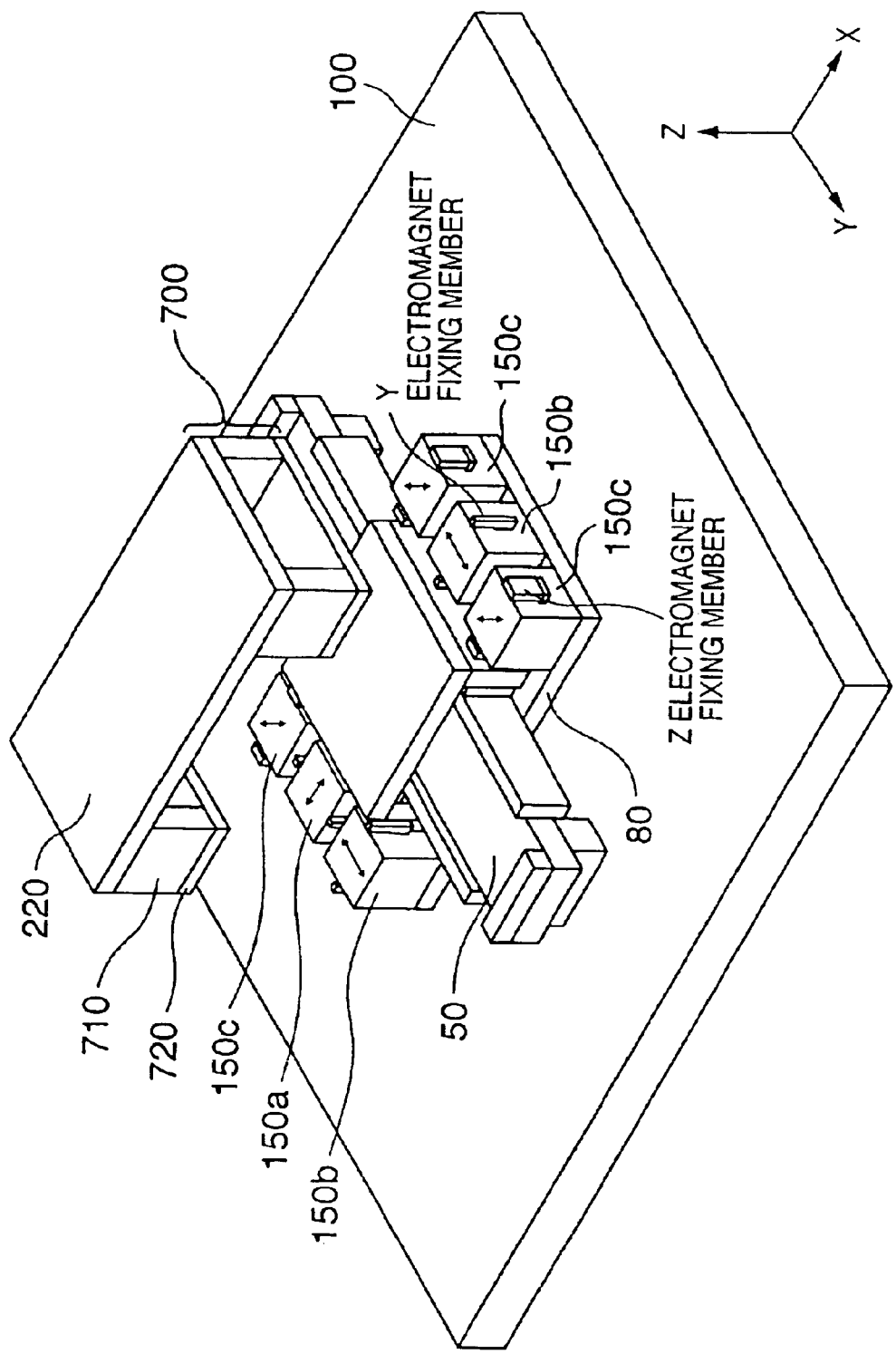
FIG. 2C is a view showing an arrangement of the fixed electromagnet units.

With respect to the X electromagnet unit, in order for the line of action of the suction power to match the center of gravity of the precision motion structure (described later), it is essential to arrange the X electromagnet unit under the X slider as shown in FIG. 2C. In other words, among the three electromagnet units arranged on each side of the Y slider, it is essential that the X electromagnet unit takes the central position of the three units.

Arrangements that satisfy both of the above-described conditions are the arrangements 830, 840, and 850 shown in FIG. 2D. After the arrangement of the X and Y electromagnet units is determined, three Z electromagnet units are arranged in the remaining locations. Note that the arrangement in FIG. 2C (840 in FIG. 2D) is shown because the Z electromagnet units are arranged with a wider spacing and a better balance compared to the other two arrangements shown in FIG. 2D.

The precision motion structure is configured with the precision-motion top plate 220, junctional plates 710, and precision-motion supporting plates 720, and has a complicated multilevel form. The reason that the structure is not configured with one plate is that the precision motion driving system is arranged far below the precision-motion top plate 220. Therefore, it is necessary to have a member that absorbs the difference in height between the position of the top plate 220 and the position of the precision motion driving system. The member which absorbs the difference is the junctional plate 710 in FIG. 2C. More specifically, an output of the precision motion driving system is received by the two precision-motion supporting plates 720. The height difference between the two precision-motion supporting plates 720 and the precision-motion top plate 220 is absorbed by connecting them with the four junctional plates 710. The output of the precision motion driving system, which is received by the supporting plates 720, is transmitted to the top plate 220 through the junctional plates 710.

By virtue of arranging the six electromagnet units not on top of the XY slider, but on the XY slider bottom plate 80 as shown in FIG. 2C or 2D, it is possible to achieve the following effects unique to the second embodiment:

it is possible to reduce the height of the entire stage; and
it is possible to arrange the electromagnet units far from the wafer surface, thereby further reducing disturbance of an electron beam.

<Third Embodiment>

Figure 3:
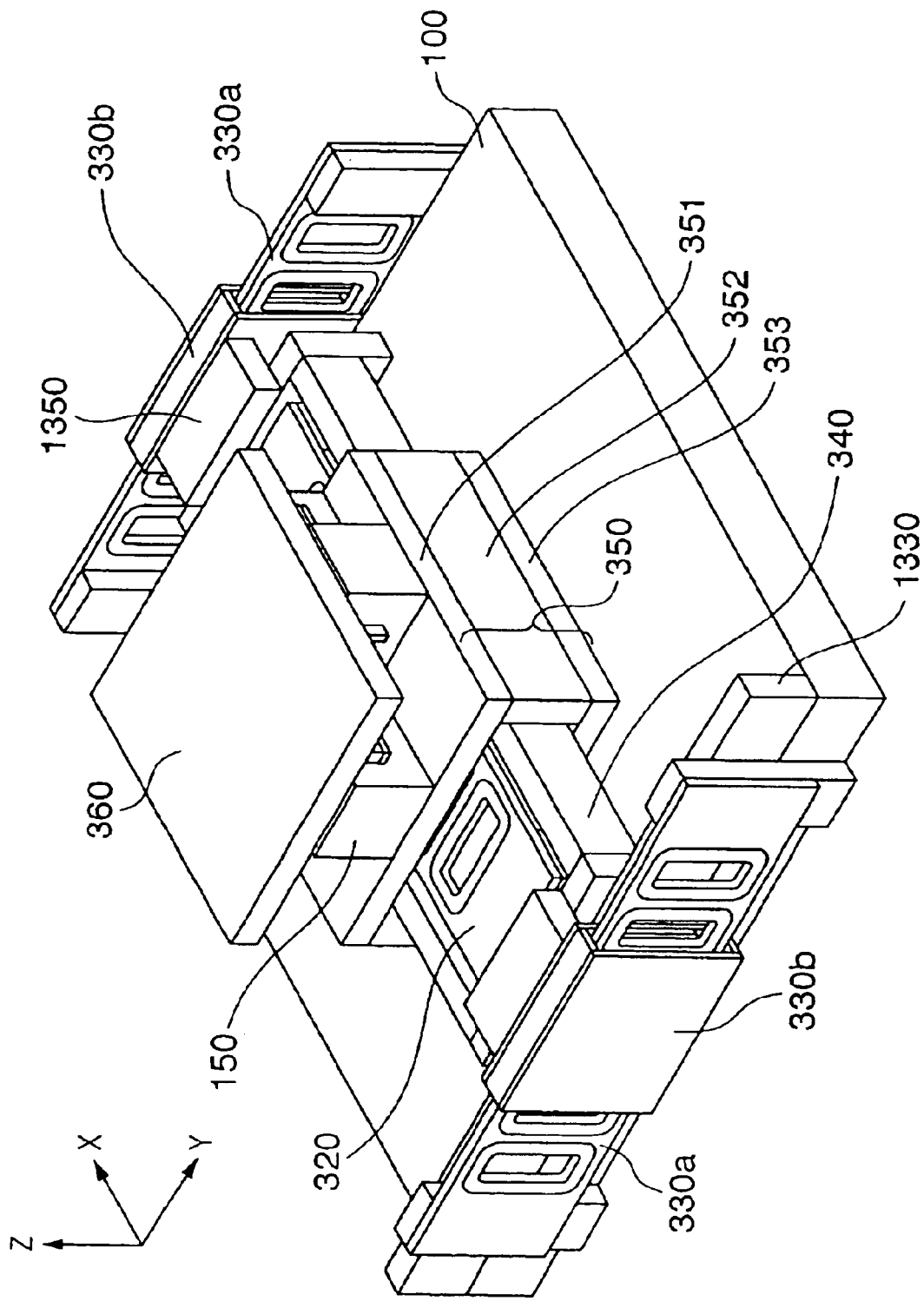
FIG. 3 is a view showing a configuration of a positioning apparatus according to the third embodiment.
Figure 4A:
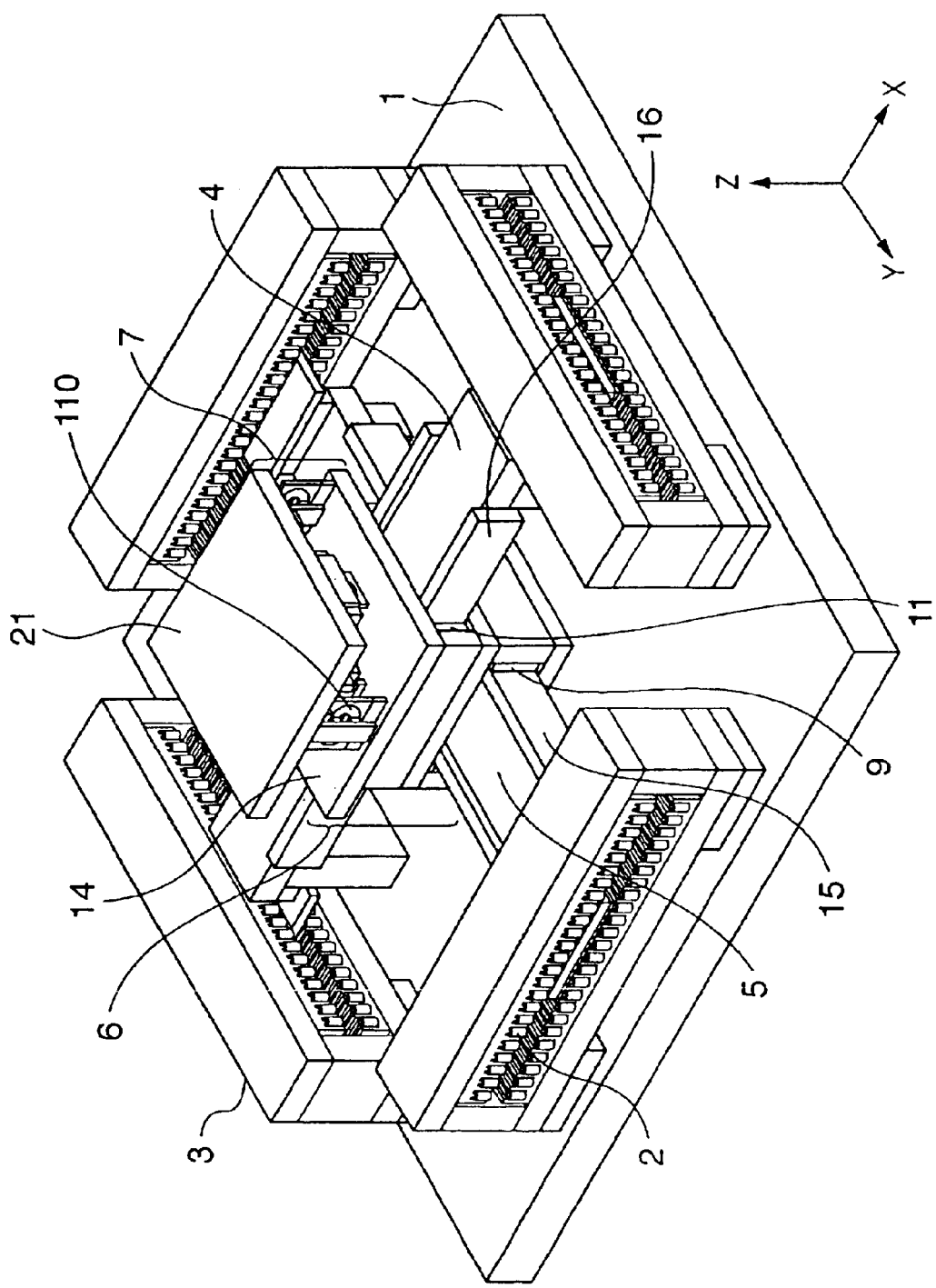
FIG. 4A is a view showing a configuration of a positioning apparatus according to a conventional example.

A configuration of the positioning apparatus according to the third embodiment is shown in FIG. 3. The precision motion driving mechanism of the third embodiment employs the same electromagnet unit 150 described in the first embodiment. However, the third embodiment differs from the first embodiment by not having an intersecting slider mechanism, i.e., the X slider 40 and Y slider 50.

As shown in FIG. 3, an X linear motor 320 is arranged on a Y slider 340 attached to a movable member 330b of a Y linear motor 330a. On a movable member (not shown) of the X linear motor 320, an XY slider 350 is arranged. The XY slider 350 is configured with a top plate 351, a side plate 352, and a bottom plate 353. On the top plate 351, the electromagnet units 150 are arranged for driving a precision-motion top plate 360.

By virtue of the configuration shown in FIG. 3, it is possible to realize downsizing of the stage mechanism for positioning on the stage table. Also, by eliminating the mediacy of transmission elements (in this embodiment, the X slider and Y slider), which transmit driving force generated by a driving source to a driving target, it is possible to enhance rigidity of the driving mechanism.

<Charged-Particle-Beam Exposure Apparatus>

A charged-particle-beam exposure apparatus incorporating the positioning apparatus described in the first to third embodiments is now described.

Figure 5:
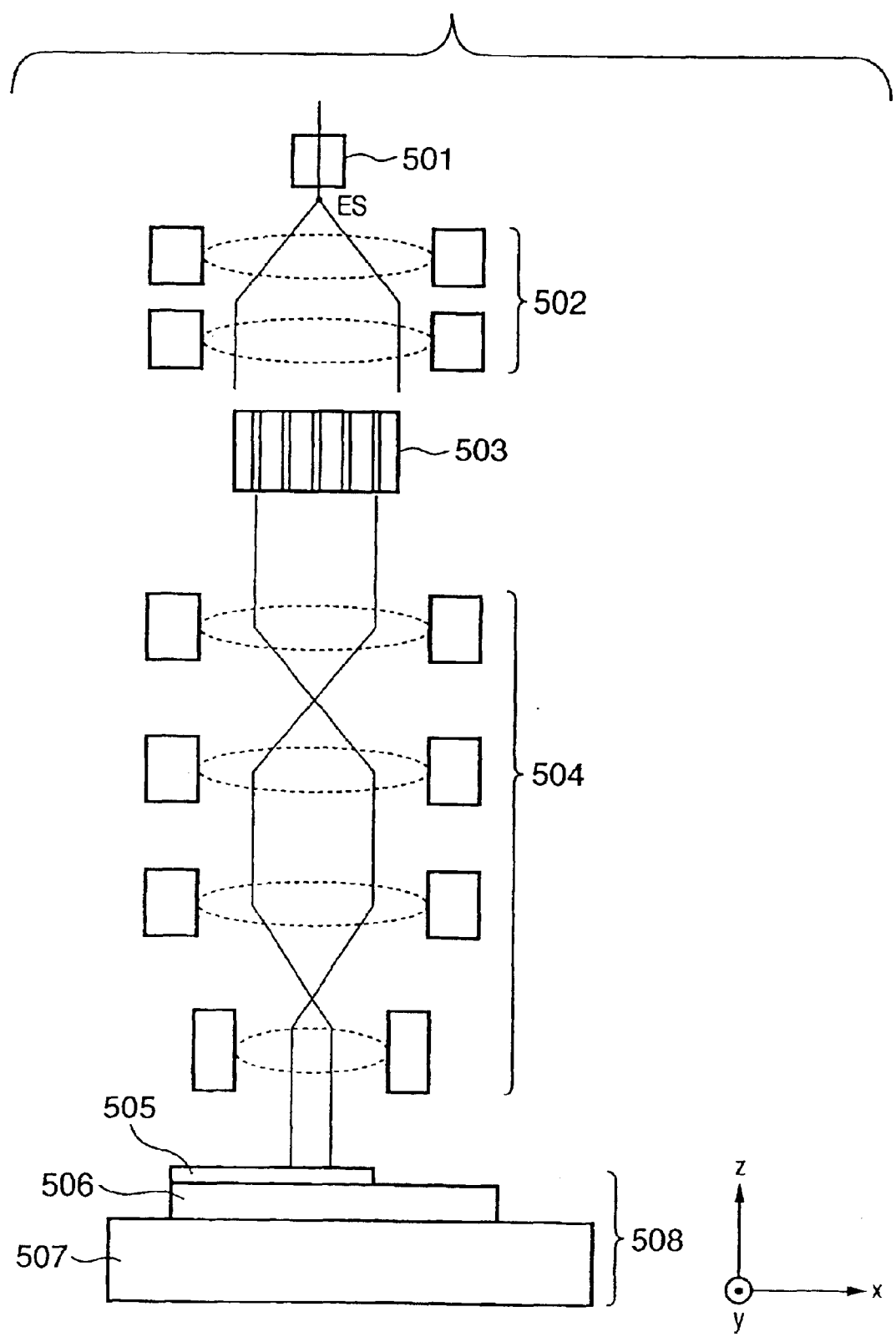
FIG. 5 is a view showing a brief construction of a charged-particle-beam exposure apparatus.

FIG. 5 shows a brief construction of the charged-particle-beam exposure apparatus. In FIG. 5, numeral 501 denotes an electron gun, which serves as a charged particle source, and includes the cathode, grid, and anode (not shown). An electron source ES irradiated by the electron gun is emitted to an electron optical system 503 through an illumination electron optical system 502. The electron optical system 503 is configured with an aperture array, a blanker array, an element electron optical array unit or the like, which are not shown. The electron optical system 503 forms a plurality of electron source (ES) images. Reduced projection is performed on the images by a projection electron optical system 504, thereby forming electron source ES images on a wafer 505 serving as an exposure target surface. A positioning apparatus 508, on which the wafer 505 is placed, is configured with a positioning mechanism 507 and a precision motion mechanism 506. The positioning mechanism 507 performs positioning on the plane by moving in the XY direction. The precision motion mechanism 506 performs more precise positioning with respect to the position determined by the positioning mechanism 507, and adjusts rotational direction of each axis.

Figure 6:
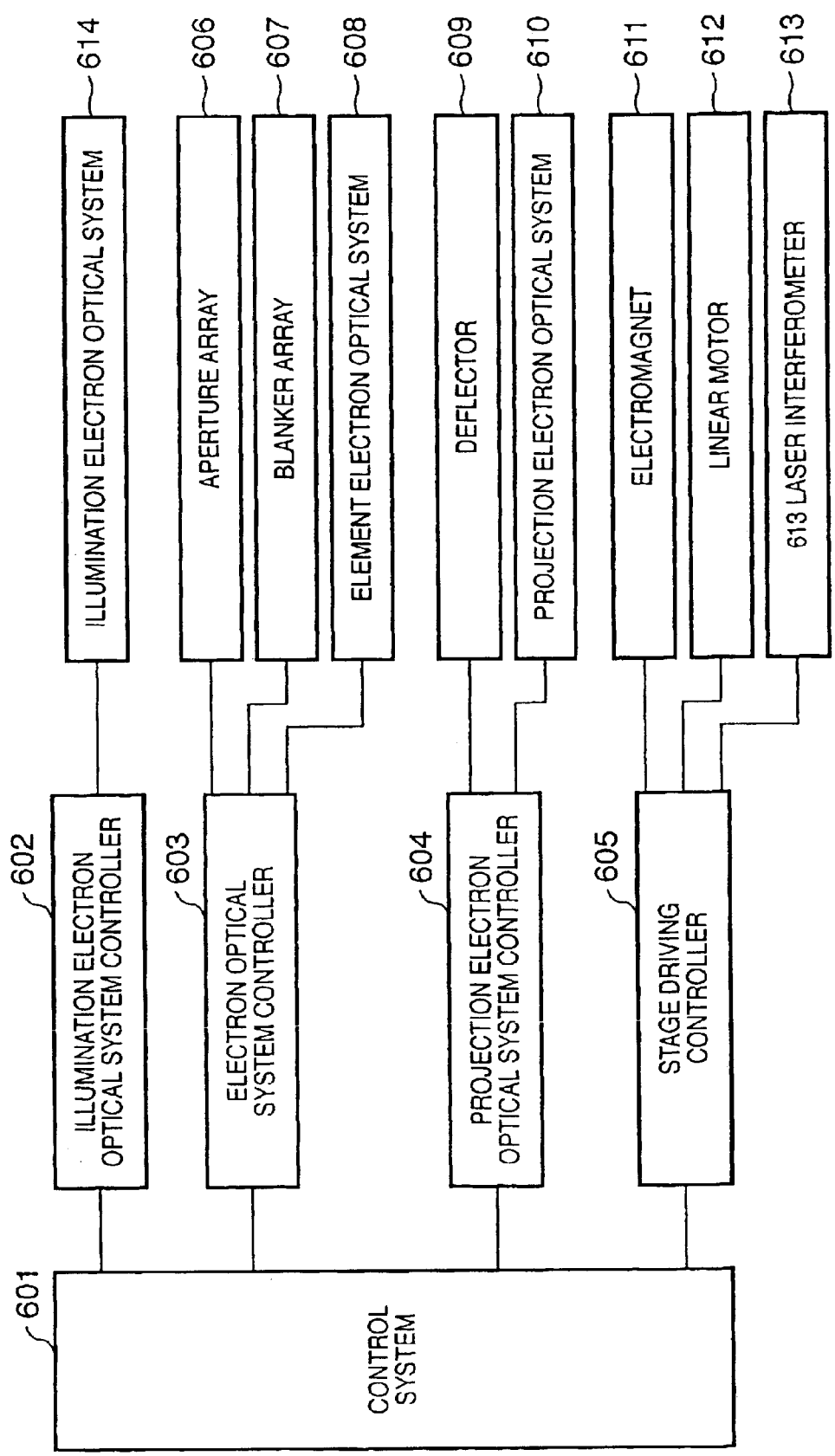
FIG. 6 is a block diagram showing a control structure of the charged-particle-beam exposure apparatus.

For the positioning apparatus 508, the positioning apparatus described in the aforementioned embodiments is employed. FIG. 6 is a block diagram showing a control structure of the charged-particle-beam exposure apparatus.

A control system 601 controls optical system controllers (602 to 604) and a stage driving controller 605 which controls positioning of the stages. The illumination electron optical system controller 602 controls an illumination electron optical system 614 based on exposure control data. The electron optical system controller 603 controls an aperture array 606, a blanker array 607, and an element electron optical system 608. The projection electron optical system controller 604 controls a deflector 609 and a projection electron optical system 610.

The stage driving controller 605 controls a current applied to the electromagnets provided for driving the precision stage 70 (FIG. 1A), thereby controlling suction power for pulling the I-cores (180a and 180b in FIG. 1C).

Also, the stage driving controller 605 drives the linear motor 612 to control positioning of the XY slider 60 on the plane of the stage table 100.

In controlling the linear motor 612 and electromagnet unit 611, the stage driving controller 605 detects position data of the movable member by a laser interferometer 613 and feeds back the position data to the control loop, thereby driving each actuator (611, 612) and positioning the wafer 505 to a target exposure position corresponding to the exposure control data.

As described above, according to the charged-particle-beam exposure apparatus incorporating the positioning apparatus of the above-described embodiments, it is possible to realize highly precise positioning of a wafer.

<Embodiment of a Semiconductor Production System>

Next, a description is provided of an example of a production system employing the above-described exposure apparatus for manufacturing semiconductor devices (e.g., semiconductor chips such as an IC or an LSI, liquid crystal panels, CCDs, thin-film magnetic heads, micro machines and so forth). According to this embodiment, troubleshooting or regular maintenance of manufacturing machines installed in a semiconductor manufacturing factory, or maintenance services such as supplying software are performed through a computer network outside the factory.

Figure 7:
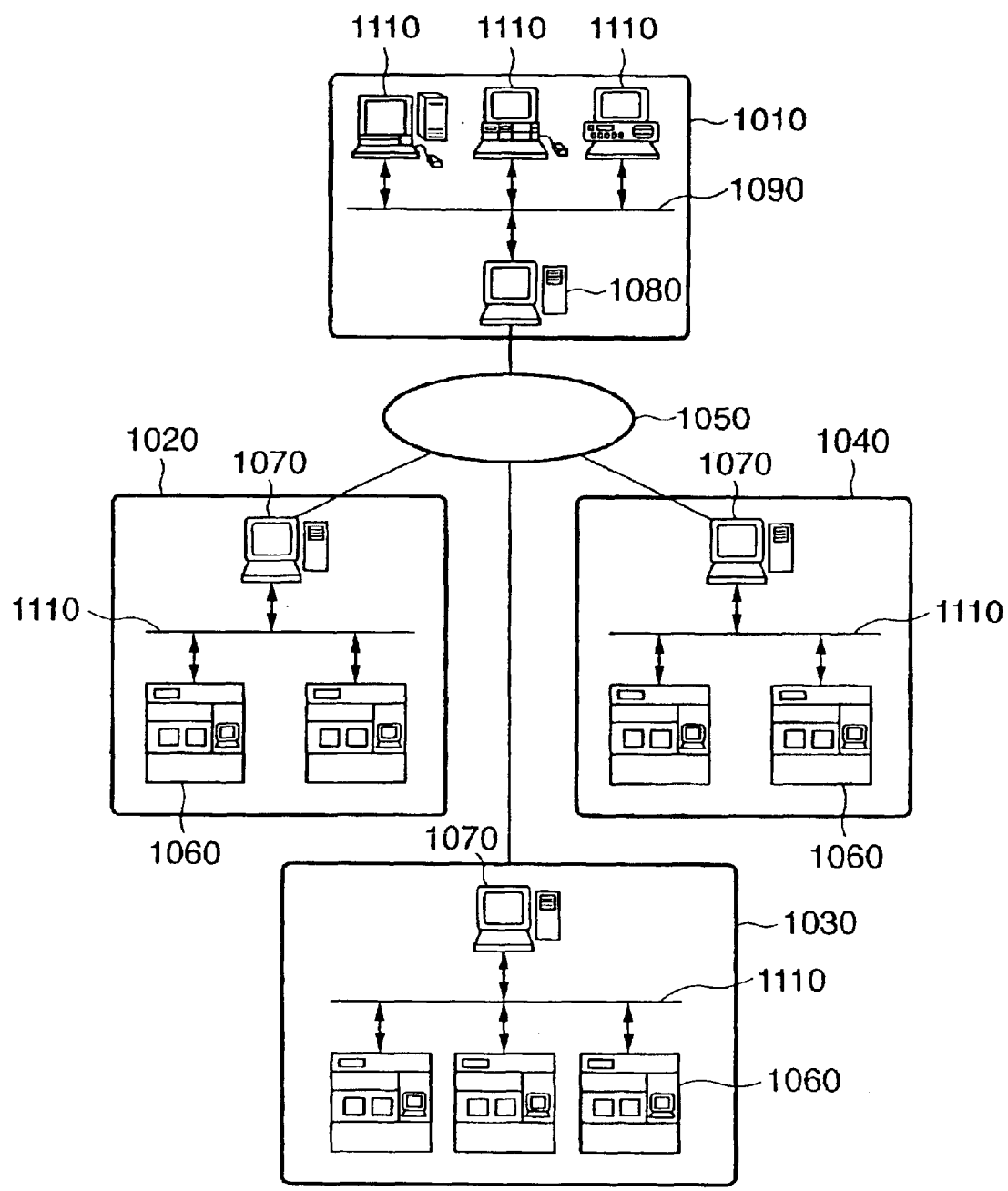
FIG. 7 is a block diagram conceptually showing a semiconductor device production system.

FIG. 7 shows an entire semiconductor device production system seen from one angle. Reference numeral 1010 in FIG. 7 denotes an office of a vendor (supplier) supplying semiconductor device manufacturing machines. Examples of the machines are semiconductor manufacturing machines for performing various processes in a semiconductor manufacturing factory, such as pre-process devices (e.g., an aligner, a resist processor, a lithography device such as an etching device, a heat processor, a deposition device, a planarization device, and so on) and post-process devices (e.g., an assembling device, an inspection device, and so on). The office 1010 includes a host management system 1080 for providing a maintenance database of the manufacturing machines, plural operation terminal computers 1100, and a local area network (LAN) 1090, which constructs an intranet by connecting the aforementioned computers. The host management system 1080 includes a gateway for connecting the LAN 1090 with an external network, i.e., the Internet 1050, and a security function for regulating external access.

Meanwhile, reference numerals 1020 to 1040 denote factories of a semiconductor manufacturer, namely, a user of the manufacturing machines. The manufacturing factories 1020 to 1040 may belong to different manufacturers, or a single manufacturer (e.g., a factory for pre-processes and a factory for post-processes). Each of the factories 1020 to 1040 includes a plurality of manufacturing machines 1060, a local area network (LAN) 1110 which constructs an intranet by connecting the machines 1060, and a host management system 1070 serving as a monitoring apparatus for monitoring an operation status of each manufacturing machine 1060. The host management system 1070 provided in each of the factories 1020 to 1040 includes a gateway to connect the LAN 1110 of each factory with an external network, i.e., the Internet 1050. By virtue of the above construction, the LAN 1110 of each factory can access the host management system 1080 of the vendor 1010 via the Internet 1050. An access to the host management system 1080 is allowed only to limited users permitted by the security function.

In this system, status information indicative of an operation status of each manufacturing machine 1060 (e.g., a symptom of an apparatus having trouble) is notified from the factory to the vendor through the Internet 1050, and a response to the notification (e.g., an instruction to cope with the trouble, or software and data for troubleshooting) or maintenance information such as the latest software or help information is transmitted from the vendor to the factory. A communication protocol (TCP/IP) generally used in the Internet is typically adopted for the data communication between the respective factories 1020 to 1040 and the vendor 1010, and for data communication within each factory through the LAN 1110. Note, in place of the Internet serving as an external network of the factory, a high-security leased-line network (e.g., an ISDN, or the like) that does not allow access of a third party may be used. Furthermore, the host management system is not limited to the one provided by a vendor. A database constructed by a user may be provided to an external network to allow access from the plural user factories.

Figure 8:
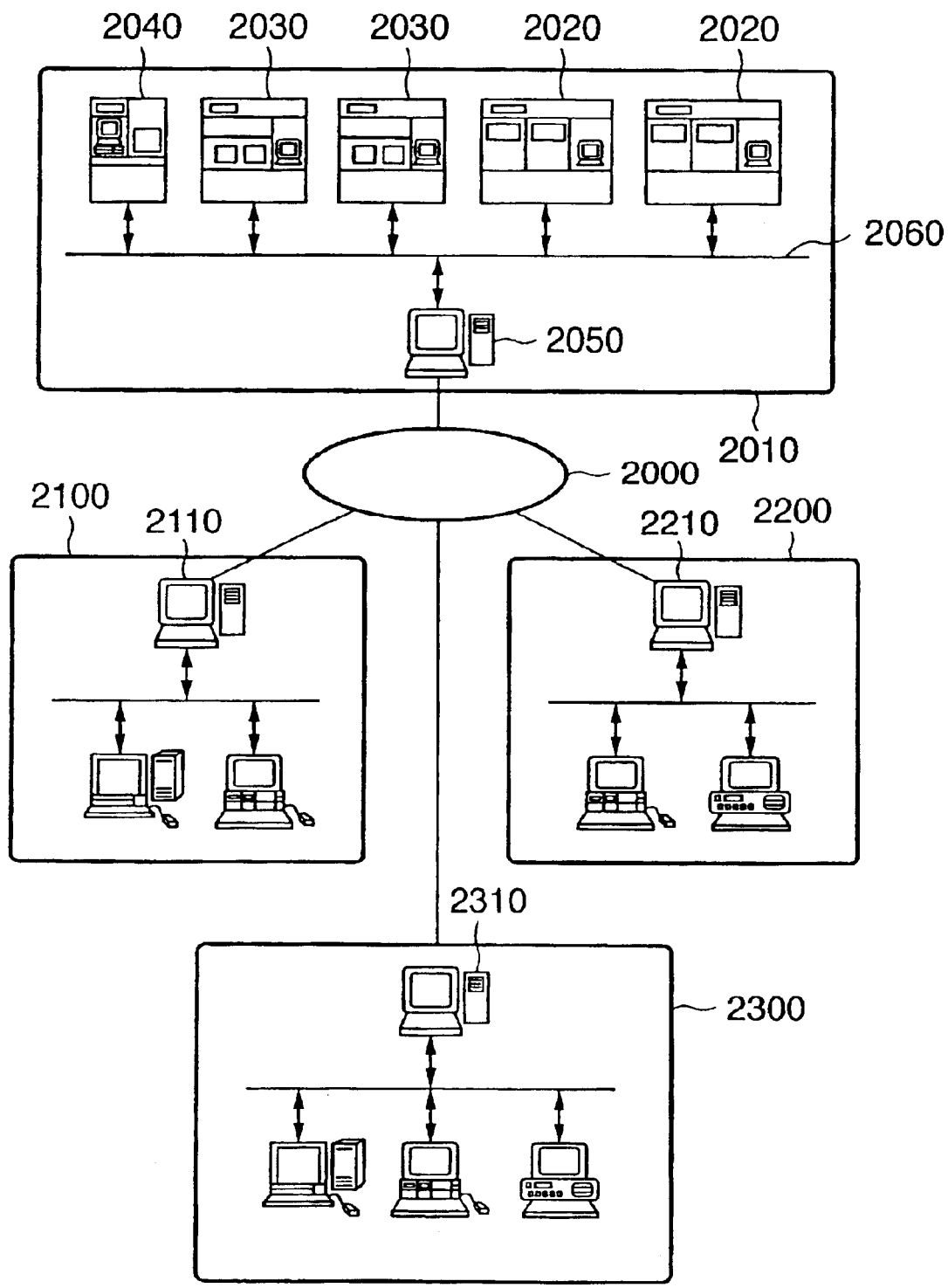
FIG. 8 is a block diagram conceptually showing a semiconductor device production system.

FIG. 8 shows an entire semiconductor device production system seen from an angle different from that of FIG. 7. In the foregoing example, plural user factories each having manufacturing machines are connected with the management system of the vendor through an external network, to communicate information regarding production management in each factory or information about at least one of the manufacturing machines. On the contrary, in the example shown in FIG. 8, a factory having manufacturing machines of plural different vendors is connected with management systems of respective vendors of the plural manufacturing machines through an external network to communicate maintenance information of each manufacturing machine. In FIG. 8, a reference numeral 2010 denotes a manufacturing factory (e.g., a semiconductor device manufacturer), namely, a user of the manufacturing machines. The production line of the factory includes the manufacturing machines for performing various processes, for example, an aligner 2020, a resist processor 2030, and a deposition device 2040. Note that although FIG. 8 shows only one factory 2010, in reality, plural factories are connected through the network. Each of the machines in the factory is connected by a LAN 2060, thereby constructing an intranet. A host management system 2050 controls operation of the production line. Meanwhile, offices of the respective vendors (suppliers), e.g., aligner manufacturer 2100, resist process manufacturer 2200, and deposition device manufacturer 2300, comprise host management systems 2110, 2210, and 2310, respectively, to perform remote maintenance of the respective machines provided. Each host management system has a maintenance database and a gateway to the external network as mentioned above. The host management system 2050, which manages each machine in the user factory, is connected with the management systems 2110, 2210, and 2310 of the respective vendors through an external network 2000, i.e., the Internet, or a leased-line network. If trouble occurs in one of the series of manufacturing machines in the production line, operation of the production line is halted. However, it is possible to quickly handle the trouble by receiving remote maintenance from the vendor of the machine having trouble through the Internet 2000. Accordingly, the halt of the production line can be minimized.

Each manufacturing machine installed in the semiconductor manufacturing factory comprises a display monitor, a network interface, and a computer for executing software stored in a storage device for accessing a network and the software for operating the machine. For the storage device, a built-in memory, hard disk, or a network file server may be used. The software for accessing a network includes an exclusive or multipurpose web browser. Such software provides a user interface, such as the screen shown in FIG. 9, on the display monitor. With the use of this interface, an operator managing the manufacturing machines in each factory inputs information, e.g., a model (401) of the manufacturing machine, a serial number (402), a title of the trouble (403), date (404), a level of urgency (405), a symptom (406), a troubleshooting method (407), a follow-up (408) and so on, in the respective areas of the screen. The inputted information is transmitted to the maintenance database through the Internet, and in response, appropriate maintenance information is returned from the maintenance database and displayed on the monitor. Moreover, the user interface provided by the web browser realizes hyperlink functions (410 to 412) shown in FIG. 9. An operator can access more detailed information of each item, download the latest version of the manufacturing machine's software from a software library provided by the vendor, or obtain an operation guide (help information) as a reference for a factory operator.

Figure 10:
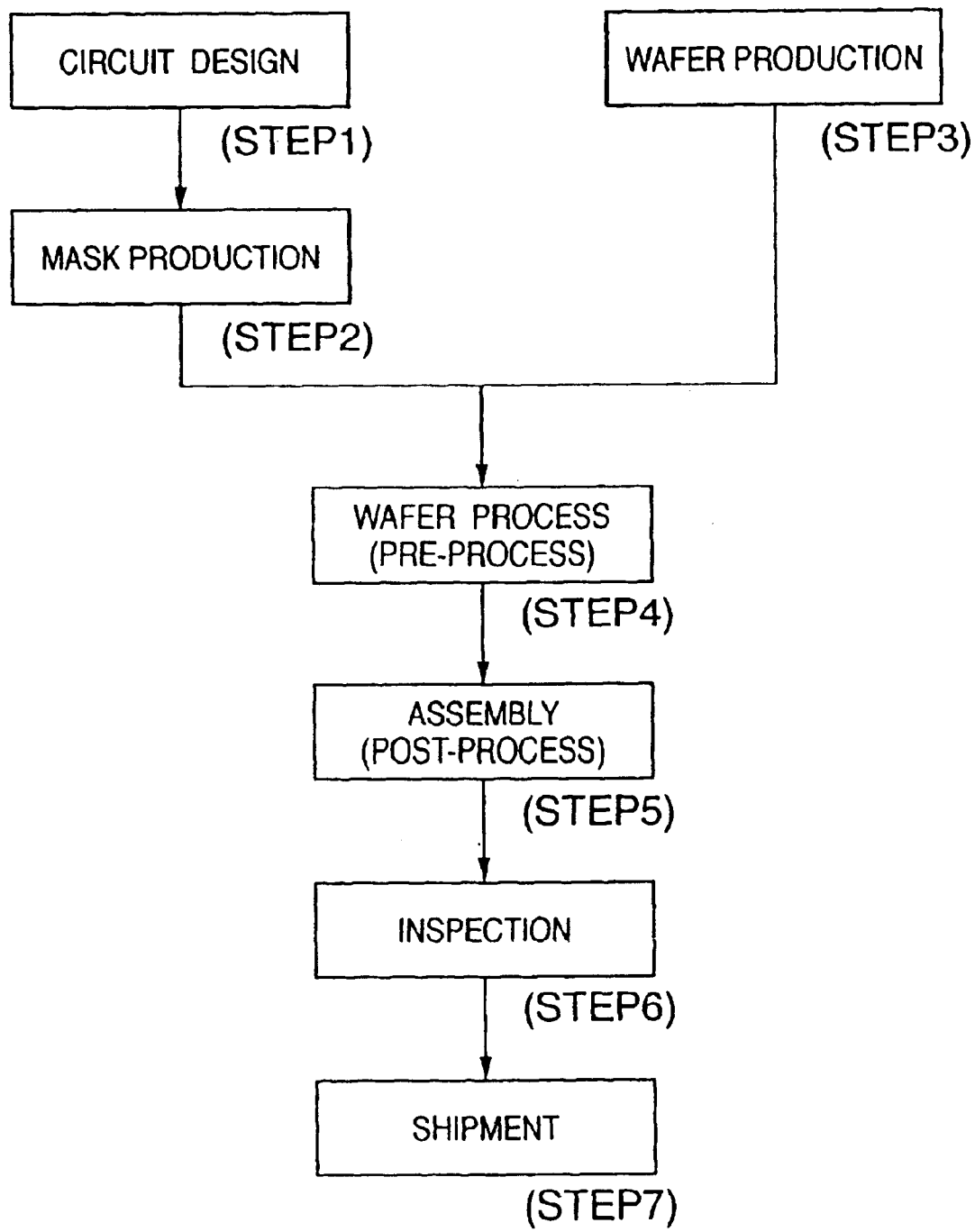
FIG. 10 is a block diagram explaining a flow of a device manufacturing process.

Next described is a semiconductor device manufacturing process employing the above-described production system. FIG. 10 shows a flow of an overall manufacturing process of a semiconductor device.

In step 1 (circuit design), a circuit of a semiconductor device is designed. In step 2 (generation of exposure control data), exposure control data of the exposure apparatus is generated based on the designed circuit pattern. Meanwhile, in step 3 (wafer production), a wafer is produced with a material such as silicon. In step 4 (wafer process), which is called a pre-process, an actual circuit is formed on the wafer using the mask and wafer by a lithography technique. In step 5 (assembly), which is called a post-process, a semiconductor chip is manufactured using the wafer produced in step 4. Step 5 includes an assembling process (dicing, bonding), a packaging process (chip embedding), and so on. In step 6 (inspection), the semiconductor device manufactured in step 5 is subjected to inspection such as an operation-check test, a durability test, and so on. Semiconductor devices are manufactured in the foregoing processes and shipped (step 7). The pre-process and post-process may be performed by different factories dedicated to each process. In this case, each of the factories receives maintenance services of the above-described remote maintenance system. The pre-process factory and post-process factory may perform data communication to exchange information regarding production management and maintenance of the machines through the Internet or a leased-line network.

Figure 11:
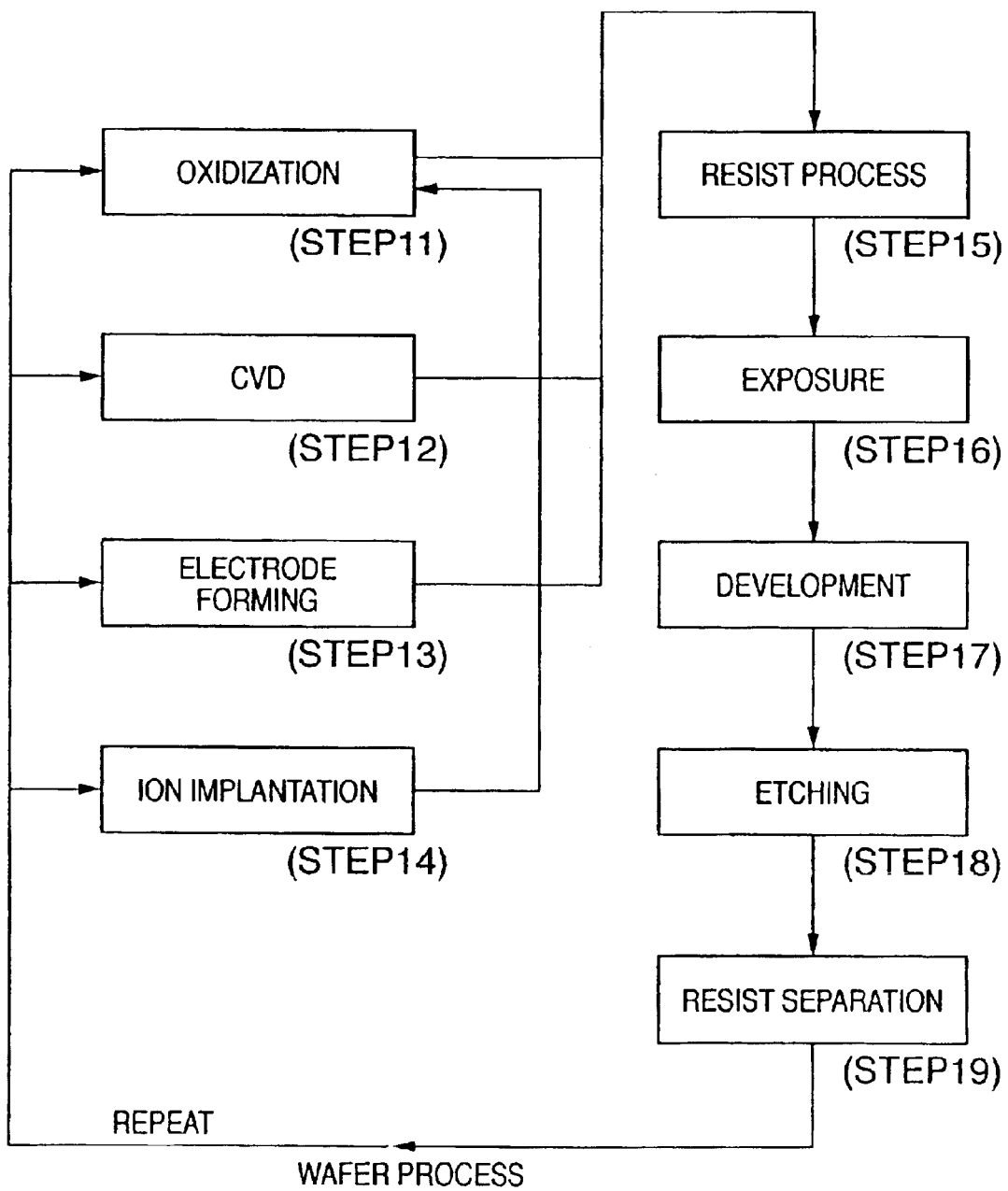
FIG. 11 is a block diagram explaining a flow of a device manufacturing process.

FIG. 11 shows a flow of the aforementioned wafer process in detail. In step 11 (oxidation), the wafer surface is oxidized. In step 12 (CVD), an insulating film is deposited on the wafer surface. In step 13 (electrode formation), electrodes are deposited on the wafer. In step 14 (ion implantation), ions are implanted on the wafer. In step 15 (resist process), a photosensitive agent is coated on the wafer. In step 16 (exposure), the circuit pattern is rendered (exposed) on the wafer by the above-described exposure apparatus. In step 17 (development), the exposed wafer is developed. In step 18 (etching), portions other than the developed resist image are removed. In step 19 (resist separation), unnecessary resist after the etching process is removed. By repeating the foregoing steps, multiple circuit patterns are formed on the wafer. The manufacturing machines used in respective processes receive maintenance of the above-described remote maintenance system. Therefore, it is possible to prevent trouble in advance, and quick recovery is possible in the case of trouble. Accordingly, better productivity of semiconductor devices can be achieved, compared to conventional productivity.

As has been described above, according to the positioning apparatus of the present invention, it is possible to realize highly precise adjustment of a position and/or a rotation angle, while eliminating an influence of a magnetic flux leakage.

By eliminating the influence of a magnetic flux leakage, it is possible to provide a positioning apparatus appropriate for a charged-particle-beam exposure apparatus.

By virtue of utilizing such a charged-particle-beam exposure apparatus, it is possible to provide a semiconductor device manufacturing method which achieves a high productivity.

As many apparently widely different embodiments of the present invention can be made without departing from the spirit and scope thereof, it is to be understood that the invention is not limited to the specific embodiments thereof except as defined in the claims.

What is claimed is:

1. A positioning apparatus comprising:
    a first stage, capable of moving in a first direction and a second direction which is orthogonal to the first direction;
    a second stage, arranged on said first stage and moved with said first stage, and capable of moving in the first direction and the second direction and capable of mounting an object to be adjusted in a position and a rotation; and
    a driving mechanism, arranged on said first stage, and for moving said second stage relative to said first stage,
    wherein said driving mechanism includes:
    a first electromagnet which generates first suction power;
    a second electromagnet, provided opposite to and away from said first electromagnet, which generates second suction power; and
    a core member, which is held movable between said first and second electromagnets, and moves by being pulled in accordance with the first and/or second suction power.

2. The positioning apparatus according to claim 1, wherein said core member is formed with a multi-layer steel plate.

3. The positioning apparatus according to claim 1, wherein said driving mechanism further comprises a plurality of magnetic shield members, which include the first and second electromagnets and the core member, to prevent magnetic flux from leaking.

4. The positioning apparatus according to claim 1, wherein said driving mechanism further comprises a fixing member which transmits a displacement to the second stage together with the core member, the displacement generated as a result of the core member being pulled in accordance with the first and/or second suction power.

5. The positioning apparatus according to claim 1, wherein said driving mechanism generates a displacement in a translational direction by pulling the core member in accordance with the first and/or second suction power, and
    positioning of the second stage is performed by providing a plurality of said driving mechanisms and generating a displacement in a rotational direction using a combination of displacement in the translational direction.

6. A charged-particle-beam exposure apparatus, comprising:
    a charged-particle source for irradiating a charged-particle beam;
    a first electron optical system, having a plurality of electron lenses, for forming a plurality of intermediate images of the charged-particle source by the plurality of electron lenses;
    a second electron optical system for projecting the plurality of intermediate images, formed by said first electron optical system, on a substrate; and
    a positioning apparatus, holding the substrate, for driving to a predetermined position to perform positioning,
    wherein said positioning apparatus comprises:
    a first stage, capable of moving in a first direction and a second direction which is orthogonal to the first direction;

a second stage, arranged on said first stage and moved with said first stage, and capable of moving in the first direction and the second direction and capable of mounting an object to be adjusted in a position and a rotation; and a driving mechanism, arranged on said first stage, and for moving said second stage relative to said first stage, wherein said driving mechanism includes:

a first electromagnet which generates first suction power;

a second electromagnet, provided opposite to and away from said first electromagnet, which generates second suction power; and a core member, which is held movable between said first and second electromagnets, and moves by being pulled in accordance with the first and/or second suction power.

7. A device manufacturing method comprising:

a step of installing a plurality of semiconductor manufacturing apparatuses, including a charged-particle-beam exposure apparatus, in a factory; and a step of manufacturing a semiconductor device by the plurality of semiconductor manufacturing apparatuses, wherein the charged-particle-beam exposure apparatus comprises:

a charged-particle source for irradiating a charged-particle beam;

a first electron optical system, having a plurality of electron lenses, for forming a plurality of intermediate images of the charged-particle source by the plurality of electron lenses;

a second electron optical system for projecting the plurality of intermediate images, formed by said first electron optical system, on a substrate; and a positioning apparatus, holding the substrate, for driving to a predetermined position to perform positioning, wherein said positioning apparatus comprises:

a first stage, capable of moving in a first direction and a second direction which is orthogonal to the first direction;

a second stage, arranged on said first stage and moved with said first stage, and capable of moving in the first direction and the second direction and capable of mounting an object to be adjusted in a position and a rotation; and a driving mechanism, arranged on said first stage, and for moving said second stage relative to said first stage, wherein said driving mechanism includes:

a first electromagnet which generates first suction power;

a second electromagnet, provided opposite to and away from said first electromagnet, which generates second suction power; and a core member, which is held movable between said first and second electromagnets, and moves by being pulled in accordance with the first and/or second suction power.

8. The device manufacturing method according to claim 7, further comprising:

a step of connecting the plurality of semiconductor manufacturing apparatuses through a local area network;

a step of connecting the local area network with an external network of the factory;

a step of acquiring information related to the charged-particle-beam exposure apparatus from a database provided on the external network through the local area network and the external network; and a step of controlling the charged-particle-beam exposure apparatus based on acquired information.

9. A semiconductor manufacturing factory, comprising:

a plurality of semiconductor manufacturing apparatuses, including a charged-particle-beam exposure apparatus;

a local area network connecting said plurality of semiconductor manufacturing apparatuses; and a gateway connecting said local area network with an external network of the semiconductor manufacturing factory, wherein said charged-particle-beam exposure apparatus comprises:

a first electron optical system, having a plurality of electron lenses, for fanning a plurality of intermediate images of the charged-particle source by the plurality of electron lenses;

a second electron optical system for projecting the plurality of intermediate images, formed by said first electron optical system, on a substrate; and a positioning apparatus, holding the substrate, for driving a predetermined position to perform positioning, wherein said position apparatus comprises:

a first stage, capable of moving in a first direction and a second direction which is orthogonal to the first direction;

a second stage, arranged on said first stage and moved with said first stage, and capable of moving in the first direction and the second direction and capable of mounting an object to be adjusted in a position and a rotation; and a driving mechanism, arranged on said first stage, and for moving said second stage relative to said first stage, wherein said driving mechanism includes:

a first electromagnet which generates first suction power;

a second electromagnet, provided opposite to and away from said first electromagnet, which generates second suction power; and a core member, which is held movable between said first and second electromagnets, and moves by being pulled in accordance with the first and/or second suction power.

10. A maintenance method of a charged-particle-beam exposure apparatus, said maintenance method comprising:

a step of preparing a database, storing information related to maintenance of the charged-particle-beam exposure apparatus, on an external network of a factory where the charged-particle-beam exposure apparatus is installed;

a step of connecting the charged-particle-beam exposure apparatus with a local area network in the factory; and a step of using the external network and the local area network to maintain the charged-particle-beam exposure apparatus based on the information stored in the database, wherein said charged-particle-beam exposure apparatus comprises:

a charged-particle source for irradiating a charged-particle beam;

a first electron optical system, having a plurality of electron lenses, for forming a plurality of intermediate images of the charged-particle source by the plurality of electron lenses;

a second electron optical system for projecting the plurality of intermediate images, formed by said first electron optical system, on a substrate; and a positioning apparatus, holding the substrate, for driving to a predetermined position to perform positioning, wherein said positioning apparatus comprises:

a first stage, capable of moving in a first direction and a second direction which is orthogonal to the first direction;

a second stage, arranged on said first stage and moved with said first stage, and capable of moving in the first direction and the second direction and capable of mounting an object to be adjusted in a position and a rotation; and a driving mechanism, arranged on said first stage, and for moving said second stage relative to said first stage, wherein said driving mechanism includes:

a first electromagnet which generates first suction power;

a second electromagnet, provided opposite to and away from said first electromagnet, which generates second suction power, and a core member, which is held movable between said first and second electromagnets, and moves by being pulled in accordance with the first and/or second suction power.

11. The positioning apparatus according to claim 1, further comprising:

a first slider for moving a coarse motion stage in a first direction, said stage being capable of moving a long distance in directions of two axes;

a second slider, arranged in a position shifted from said first slider in a height direction and arranged in a higher position than said first slider, which is capable of moving in a second direction substantially orthogonal to a moving direction of said first slider; and a third slider, arranged near an intersecting position of said first slider and said second slider, which enables movement on a plane substantially parallel to the first direction and the second direction, wherein a total of six electromagnet units are provided for controlling a position of a precision stage, three of which being arranged on each side of said first slider along a lateral face of said first slider.

12. The positioning apparatus according to claim 11, wherein one of the electromagnet units arranged along the lateral face of said first slider generates force in the first direction, and two of the electromagnet units generate force in the second direction.

13. The positioning apparatus according to claim 11, wherein the electromagnet unit which generates force in the first direction is arranged in the center of the three electromagnet units arranged along the lateral face of said first slider, and the two electromagnet units which generate force in the second direction are arranged on both sides of said first slider in a way to sandwich said first slider.

* * * * *